(12) United States Patent
Kondo et al.

(10) Patent No.: US 10,749,533 B2
(45) Date of Patent: Aug. 18, 2020

(54) OSCILLATOR, ELECTRONIC APPARATUS AND VEHICLE

(71) Applicant: SEIKO EPSON CORPORATION, Tokyo (JP)

(72) Inventors: Manabu Kondo, Matsumoto (JP); Kazuhiko Shimodaira, Minowa-machi (JP); Kenji Hayashi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/432,989

(22) Filed: Jun. 6, 2019

(65) Prior Publication Data

US 2019/0379325 A1 Dec. 12, 2019

(30) Foreign Application Priority Data

Jun. 7, 2018 (JP) ................................ 2018-109227

(51) Int. Cl.

| | |
|---|---|
| *H03L 1/04* | (2006.01) |
| *H03B 5/04* | (2006.01) |
| *H03B 1/02* | (2006.01) |
| *H03B 5/32* | (2006.01) |
| *H03L 1/02* | (2006.01) |
| *H01L 41/053* | (2006.01) |
| *H01L 23/055* | (2006.01) |
| *H01L 25/16* | (2006.01) |
| *H01L 23/34* | (2006.01) |
| *B60R 16/023* | (2006.01) |
| *H01L 41/047* | (2006.01) |

(52) U.S. Cl.
CPC .............. *H03L 1/04* (2013.01); *B60R 16/023* (2013.01); *H01L 23/055* (2013.01); *H01L 23/345* (2013.01); *H01L 25/165* (2013.01); *H01L 41/0475* (2013.01); *H01L 41/0533* (2013.01); *H03B 1/02* (2013.01); *H03B 5/04* (2013.01); *H03B 5/32* (2013.01); *H03L 1/028* (2013.01)

(58) Field of Classification Search
CPC .. H03L 1/04; H03L 1/028; H03B 1/02; H03B 5/04; H03B 5/32; H03B 5/36; H03B 5/30
See application file for complete search history.

(56) References Cited

U.S. PATENT DOCUMENTS 7,825,742 B2 * 11/2010 Lee ........................... H03L 1/04
331/158
9,287,881 B2 * 3/2016 Shimodaira .............. H03H 9/17
(Continued)

FOREIGN PATENT DOCUMENTS

| JP | 2008-028620 A | 2/2008 |
|---|---|---|
| JP | 2010098418 A | 4/2010 |

(Continued)

*Primary Examiner* — Ryan Johnson
(74) *Attorney, Agent, or Firm* — Oliff PLC

(57) ABSTRACT

An oscillator includes a board having a first surface, and provided with a housing section opening on the first surface, a resonator including a resonator element and a resonator package configured to house the resonator element, a heat generator attached to the resonator, electrically connected to the resonator package, and disposed inside the housing section, and a plurality of lead terminals connected to the board, and configured to support the resonator.

12 Claims, 15 Drawing Sheets

(56) References Cited

U.S. PATENT DOCUMENTS

2006/0290239 A1* 12/2006 Kasahara ............. H03H 9/0514
                                                        310/346
2008/0018409 A1    1/2008 Okubo
2013/0314169 A1   11/2013 Tokuhashi
2014/0368283 A1   12/2014 Shimodaira et al.

FOREIGN PATENT DOCUMENTS

| JP | 2010-177732 A | 8/2010 |
| JP | 2013-243629 A | 12/2013 |
| JP | 2015-002363 A | 1/2015 |

* cited by examiner

OSCILLATOR, ELECTRONIC APPARATUS AND VEHICLE

The present application is based on, and claims priority from JP Application Serial Number 2018-109227, filed Jun. 7, 2018, the disclosure of which is hereby incorporated by reference herein in its entirety.

BACKGROUND

1. Technical Field

The present disclosure relates to an oscillator, an electronic apparatus, and a vehicle.

2. RELATED ART

In the past, there has been known an oscillator as an electronic device which heats a resonator packaged, aboard on which the resonator is mounted and so on to thereby stabilize the temperature of the resonator and the board, and thus stabilize the resonance frequency. For example, in JP-A-2015-2363 (Document 1), there is disclosed an oscillator in which a resonator having a resonator element housed in a package is coupled to a first surface of a board, and a heat generator is coupled to a reverse surface of the resonator and fits into a through hole provided to the board. In this oscillator, by a terminal of the heat generator coupled to the reverse surface of the resonator being coupled to a second surface as a surface at the opposite side to the first surface of the board, it is possible to heat the board from both of the first surface and the second surface to thereby keep the temperature of the board constant. According to such a configuration, it is possible to stabilize the temperature of the resonator and the board to obtain the oscillator with the characteristics such as the resonance frequency stabilized.

However, in the oscillator of Document 1, since the resonator is rigidly coupled to the two surfaces, namely the first surface and the second surface, of the board with own terminal and the terminal of the heat generator coupled to the reverse surface of the resonator, an impact applied from the outside of the oscillator easily propagates to the resonator via the substrate. There is a possibility that the impact having propagated to the resonator causes stress in a support section (a mount section) of the resonator element housed in the package of the resonator, and thus the stress has a harmful influence on the oscillation characteristic of the oscillator.

SUMMARY

An oscillator according to the present aspect includes a board having a first surface, and provided with a housing section opening on the first surface, a resonator including a resonator element and a resonator package configured to house the resonator element, a heat generator attached to the resonator, electrically connected to the resonator package, and disposed inside the housing section, and a plurality of lead terminals connected to the board, and configured to support the resonator.

In the oscillator described above, the housing section may be a through hole penetrating the first surface and the board, or a recessed section having a bottom.

In the oscillator described above, the lead terminal may include a mounting pad to connected to the board, a connection terminal configured to be connected to the resonator package, and a support lead section configured to connect the mounting pad and the connection terminal to each other, the support lead section may include a folding-back part, and the folding-back part may include a first extending part extending in one direction from the connection terminal in a plan view along a direction perpendicular to the first surface, and a second extending part folded back from the first extending part via a coupling part and extending.

In the oscillator described above, the mounting pad may be provided with a hole part penetrating a reverse surface opposed to the first surface and an obverse surface at an opposite side to the reverse surface.

In the oscillator described above, a plurality of the lead terminals may be arranged along a first direction at each of both sides of the resonator package in the plan view along a direction perpendicular to the first surface, and the support lead section may have a shape line-symmetrical about a first center line passing through a center of the resonator package along the first direction, and may have a shape line-symmetrical about a second center line passing through a center of the resonator package along a second direction perpendicular to the first direction.

In the oscillator described above, the plurality of lead terminals may electrically be connected to the board via an electrically conductive bonding material, and the electrically conductive bonding material may be disposed between the lead terminal and the board in a cross-sectional view along a direction perpendicular to a direction perpendicular to the first surface.

In the oscillator described above, the plurality of lead terminals may include a first part connected to the board, and a second part coupled to the resonator, and a thickness of the first part and a thickness of the second part may be different from each other.

In the oscillator described above, the thickness of the first part may be smaller than the thickness of the second part.

In the oscillator described above, the plurality of lead terminals may include a first part connected to the board, a second part coupled to the resonator, and a third part configured to connect the first part and the second part to each other in a stepped manner, and the second part may be longer in distance from the board than the first part.

In the oscillator described above, the plurality of lead terminals may include a first lead terminal, a second lead terminal and a third lead terminal, the heat generator may be an NPN bipolar transistor, the resonator may include a first pad connected to a collector terminal of the heat generator, a second pad connected to a base terminal of the heat generator, a third pad connected to an emitter terminal of the heat generator, a first terminal connected to the first lead terminal, a second terminal connected to the second lead terminal, a third terminal connected to the third lead terminal, a first interconnection configured to electrically connect the first pad and the first terminal to each other, a second interconnection configured to electrically connect the second pad and the second terminal to each other, and a third interconnection configured to electrically connect the third pad and the third terminal to each other, and a wiring length of the first interconnection may be longer than a wiring length of the second interconnection, and longer than a wiring length of the third interconnection.

In the oscillator described above, the plurality of lead terminals may include a first lead terminal and a second lead terminal, the heat generator may include a first heat generation terminal and a second heat generation terminal lower in heat generation amount than the first heat generation terminal, the first heat generation terminal may electrically be connected to the first lead terminal, the second heat generation terminal may electrically be connected to the second lead terminal, and a distance between the first heat generation terminal and the first lead terminal may be longer than a distance between the second heat generation terminal and the second lead terminal.

An electronic apparatus according to the present aspect includes any one of the oscillators described above, and a processing circuit configured to perform signal processing based on an output signal of the oscillator.

A vehicle according to the present aspect includes any one of the oscillators described above, and a processing circuit configured to perform signal processing based on an output signal of the oscillator.

DESCRIPTION OF EXEMPLARY EMBODIMENTS

Figure 1:
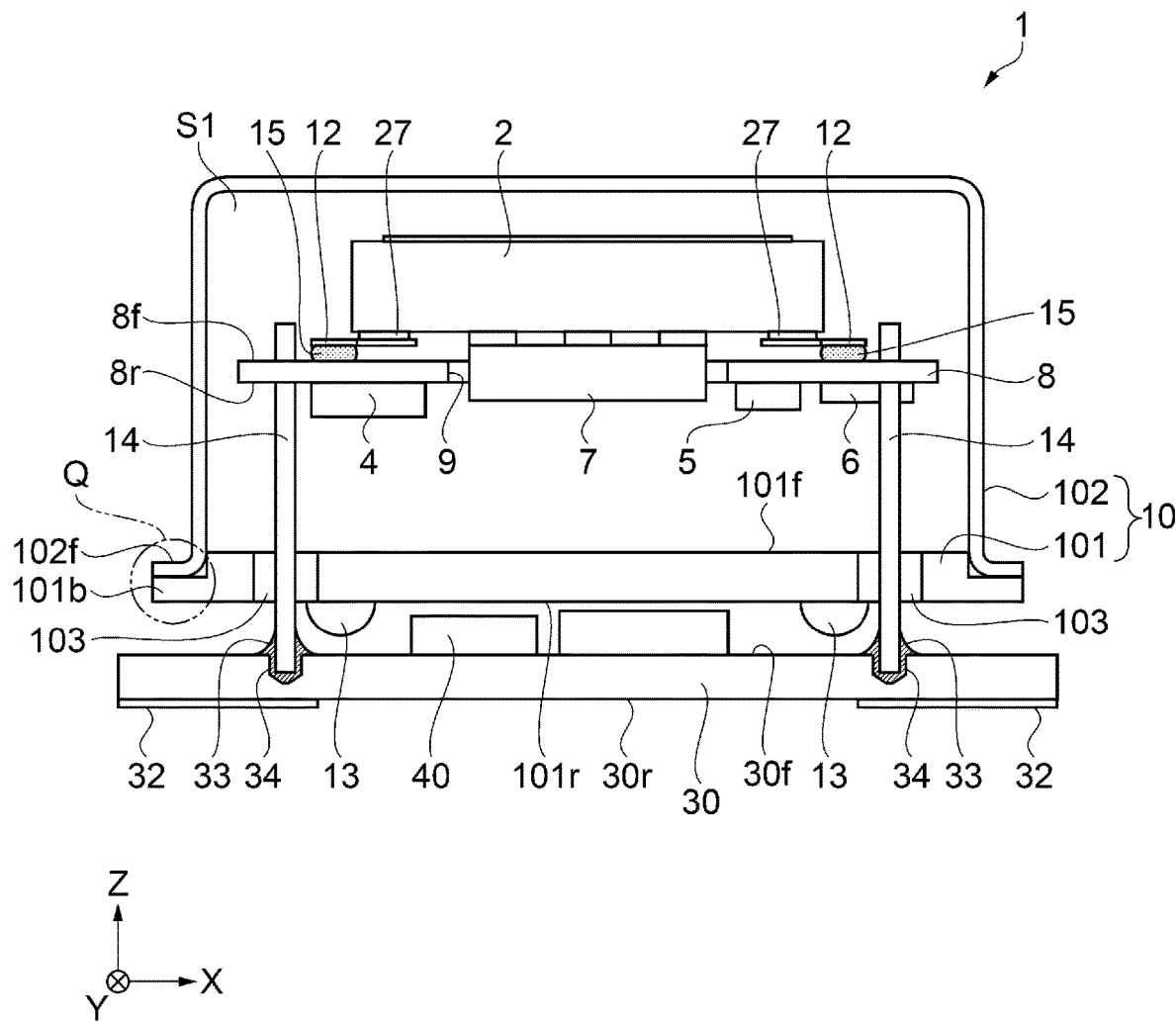
FIG. 1 is a cross-sectional view of an oscillator according to a first embodiment.

Hereinafter, oscillators and electronic apparatuses according to some embodiments of the present disclosure will be described in detail based on the embodiments shown in the accompanying drawings. It should be noted that the embodiments described below do not unreasonably limit the contents of the present disclosure as set forth in the appended claims. Further, all of the constituents described in each of the embodiments are not necessarily essential elements of the present disclosure.

It should be noted that in the drawings referred to below, three axes perpendicular to each other are set as an X axis, a Y axis and a Z axis for the sake of convenience of explanation, and the Z axis coincides with a thickness direction of the oscillator, in other words, an arrangement direction of a base and a cap bonded to the base. In still other words, the Z axis is set in a direction coinciding with an arrangement direction of the base, a resonator housed in housing a space formed of the base and the cap, and a board, and a direction coinciding with a direction perpendicular to a surface of the board to which an oscillation circuit unit and lead terminals for supporting the resonator are coupled. Further, the X axis and the Y axis are perpendicular to each other in a virtual plane including the surface of the board to which the oscillation circuit unit is coupled, wherein the X axis is parallel to a direction in which the lead terminals arranged in two lines are opposed to each other, and the Y axis is parallel to an arranging direction of the lead terminals and an arranging direction of pin terminals for supporting the board. Further, a direction parallel to the X axis is referred to as an "X-axis direction," a direction parallel to the Y axis is referred to as a "Y-axis direction," and a direction parallel to the Z axis is referred to as a "Z-axis direction" in some cases. Further, a direction along the Z axis from the base to the board is defined as the +Z-axis direction, and an opposite direction to the +Z-axis direction is defined as the −Z-axis direction. Further, for the sake of convenience of explanation, in the following explanation, a surface on the +Z-axis direction side is referred to as an upper surface, and a surface on the −Z-axis direction side is referred to as a lower surface in the plan view viewed from the Z-axis direction in some cases. Further, some of interconnection patterns and electrode pads (terminal electrodes) formed inside the case including the base are illustrated, and the rest thereof are omitted from the illustration.

First Embodiment

Figure 2:
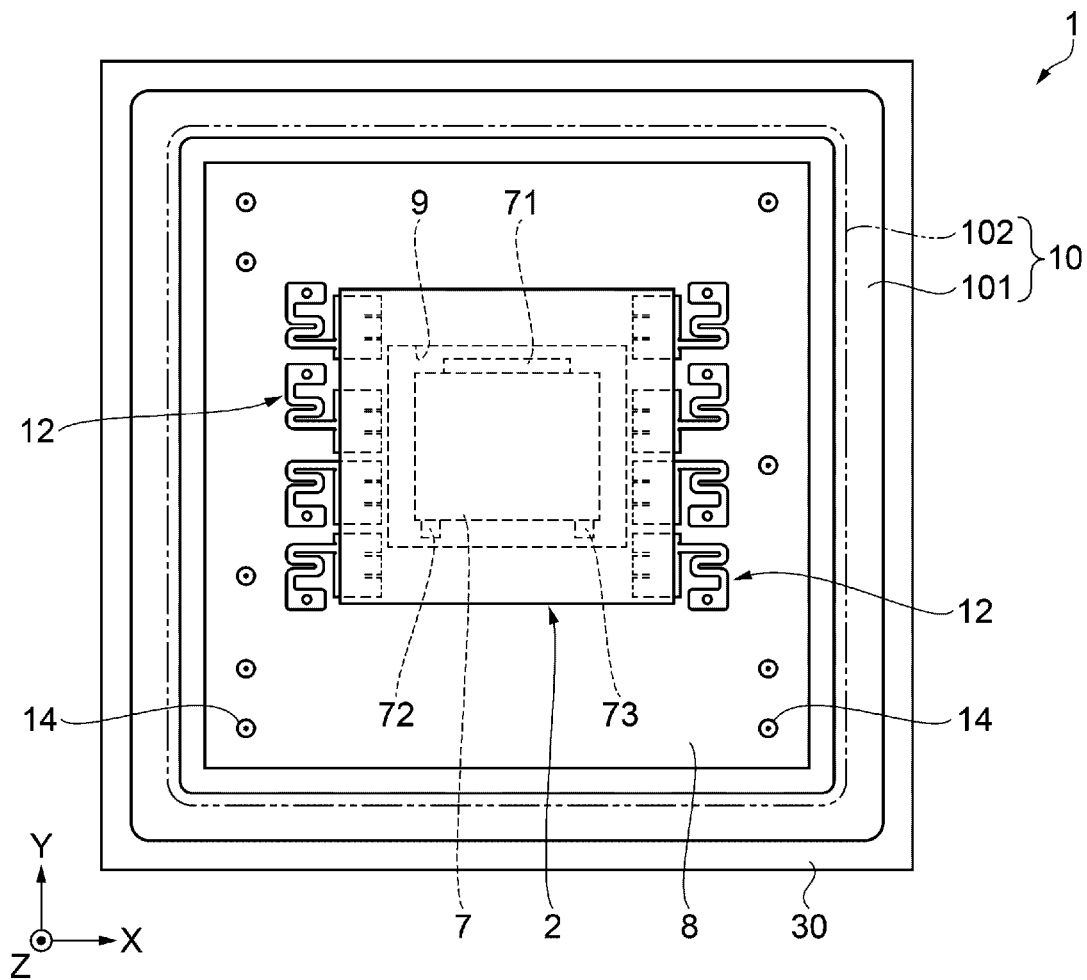
FIG. 2 is a plan view of the oscillator according to the first embodiment.
Figure 3:
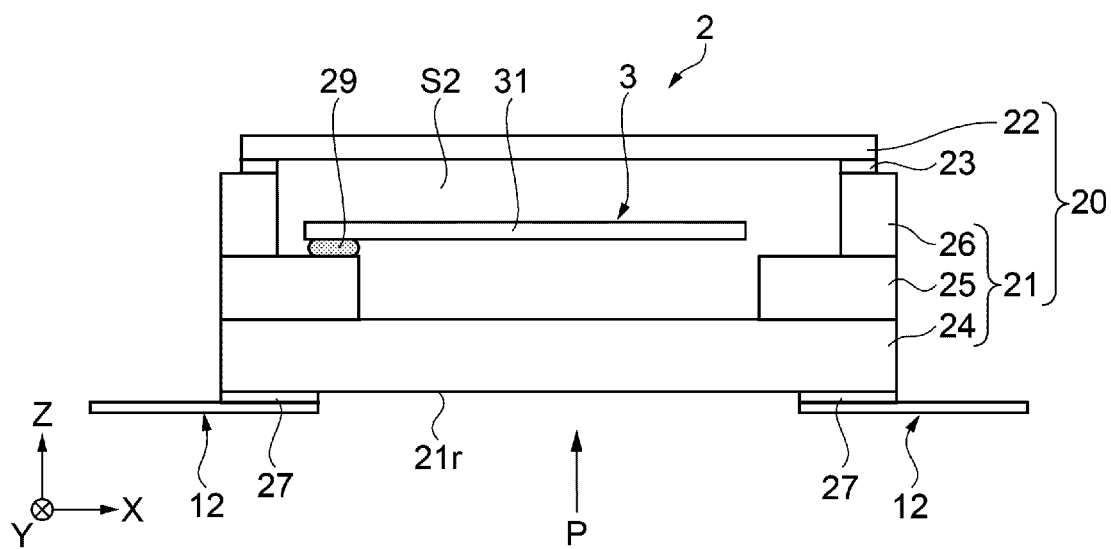
FIG. 3 is a cross-sectional view showing a resonator and lead terminals.
Figure 4:
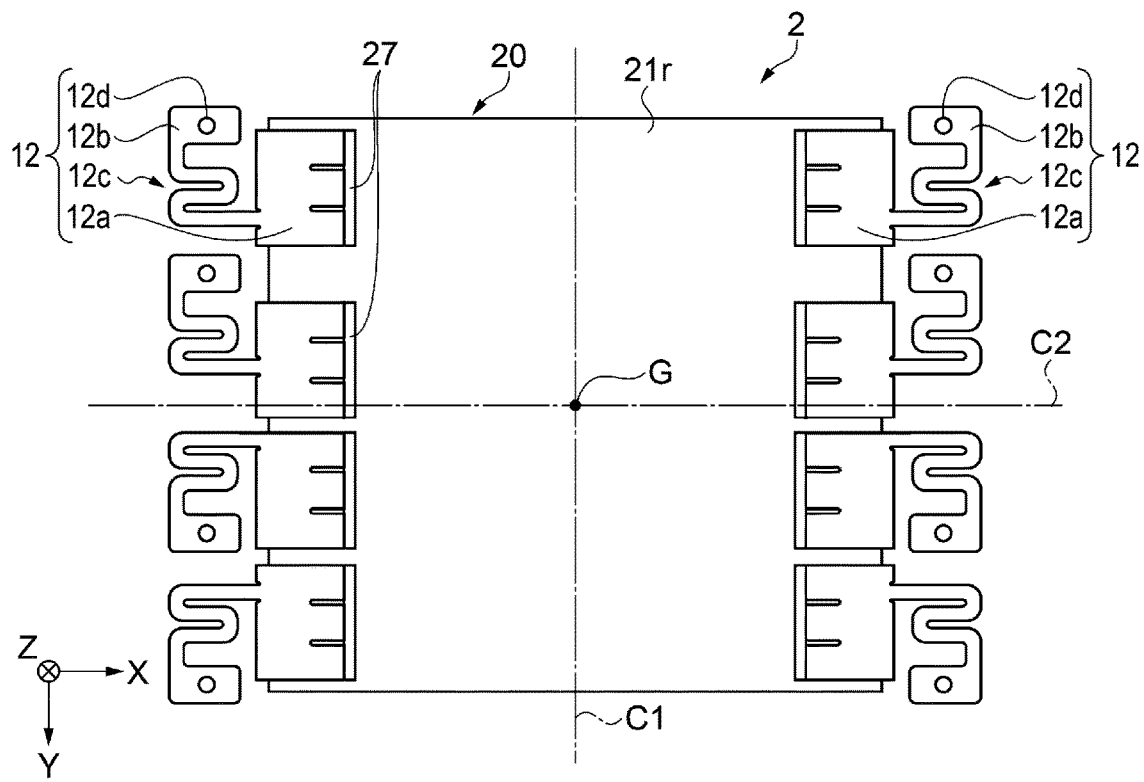
FIG. 4 is a P-view in FIG. 3 showing the resonator and the lead terminals.
Figure 5:
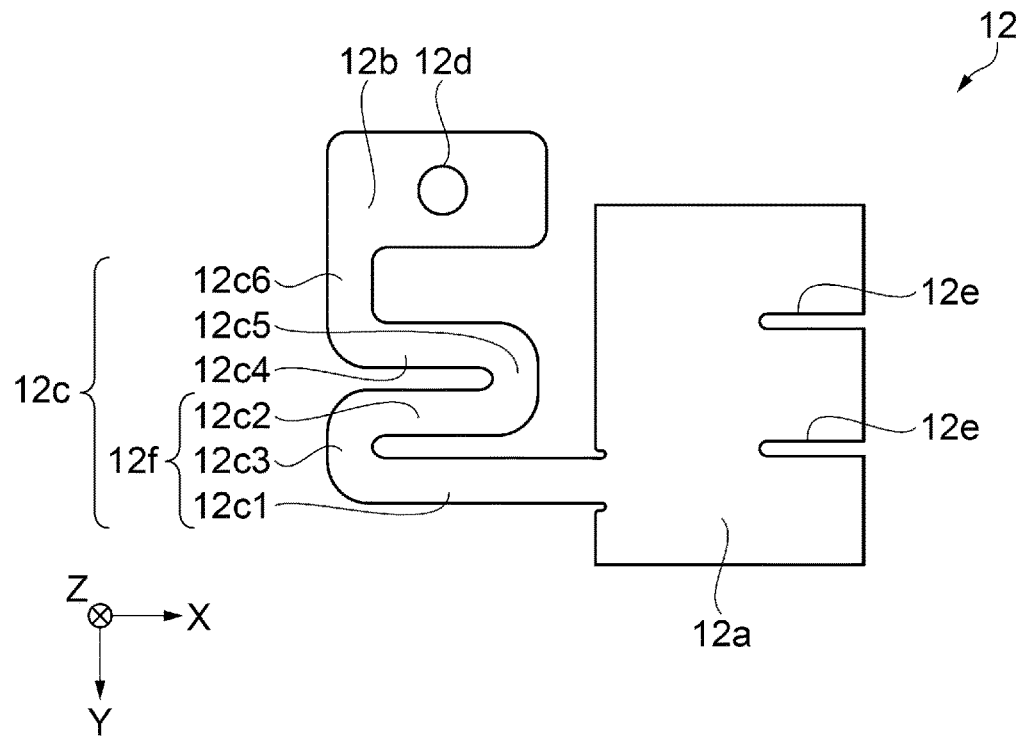
FIG. 5 is a plan view showing a configuration of the lead terminal.
Figure 6:
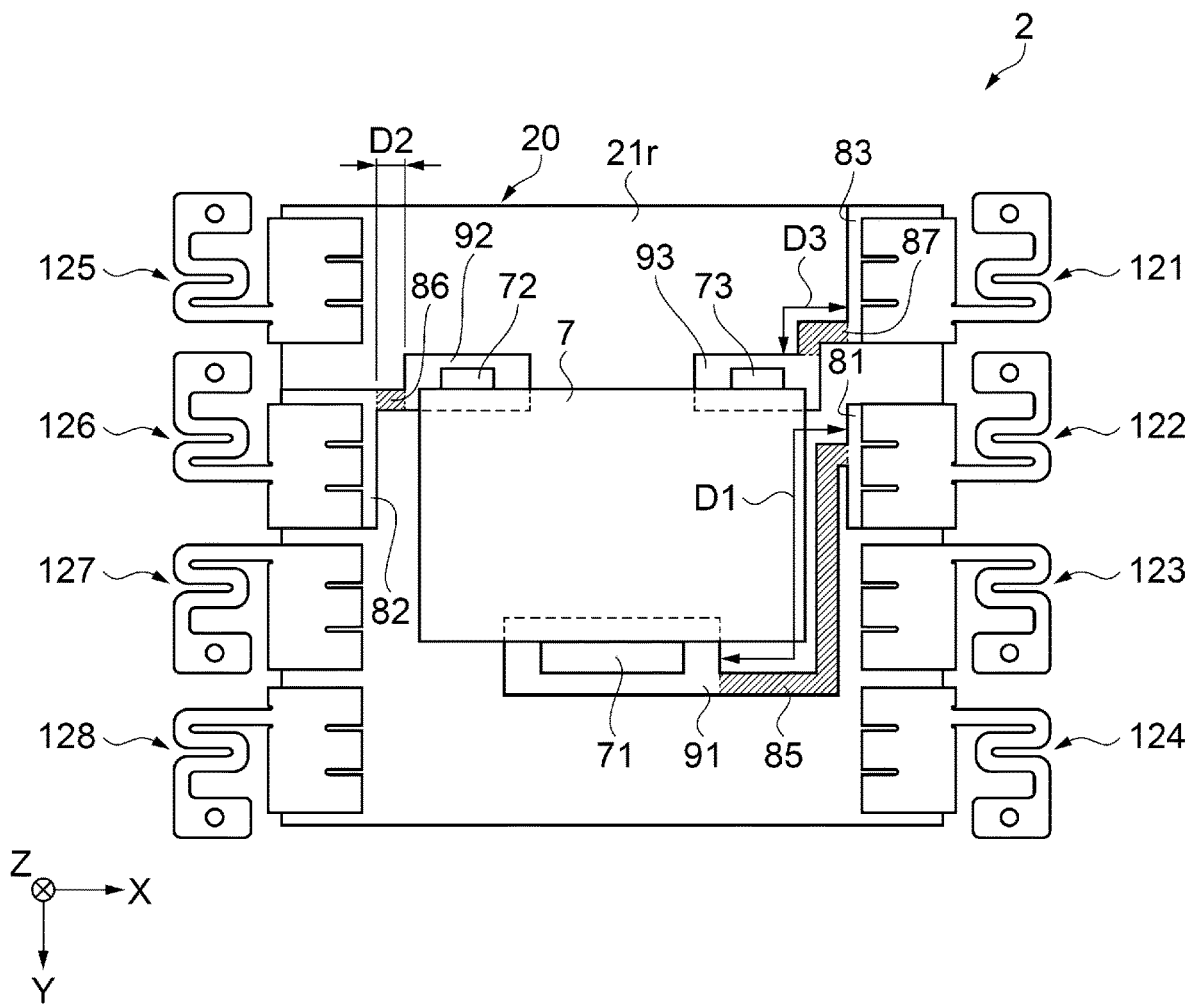
FIG. 6 is a P-view in FIG. 3 showing a heat generator and a resonator package.
Figure 7:
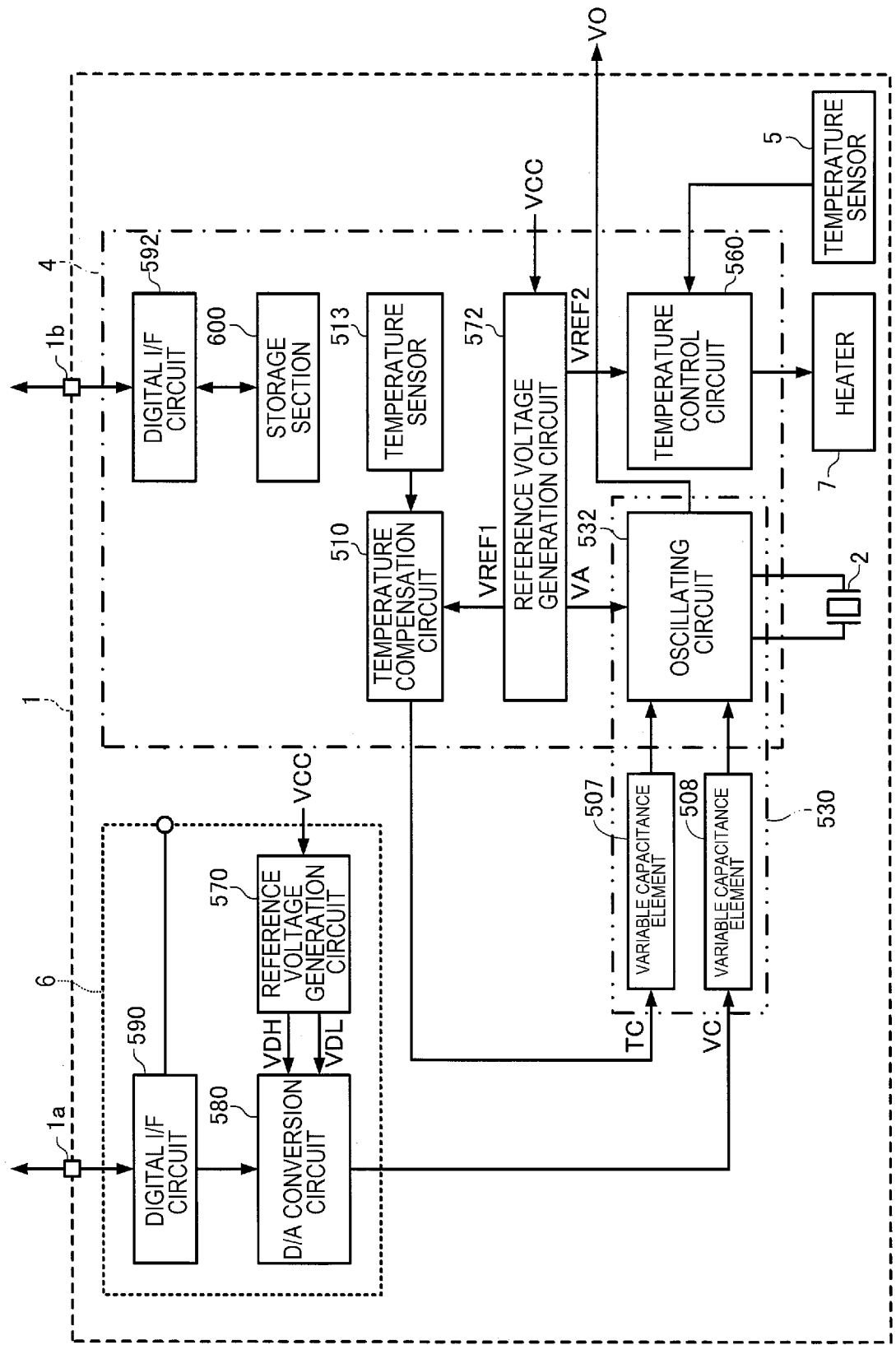
FIG. 7 is a functional block diagram of the oscillator.
Figure 8:
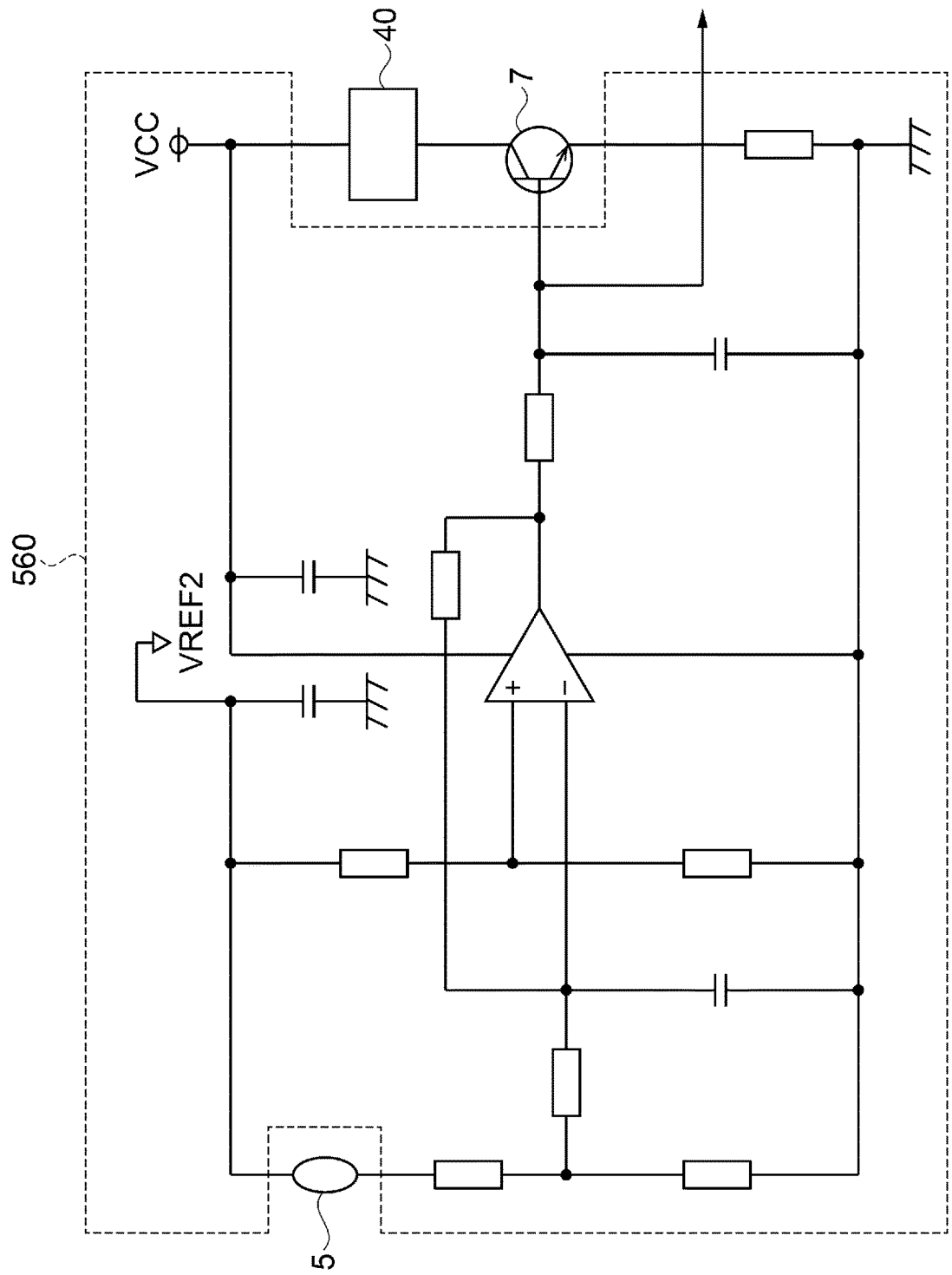
FIG. 8 is a diagram showing a configuration example of a temperature control circuit.

Firstly, an oscillator according to a first embodiment will be described with reference to FIG. 1 through FIG. 8. Here, FIG. 1 is a cross-sectional view of the oscillator according to the first embodiment. FIG. 2 is a plan view of the oscillator according to the first embodiment. It should be noted that in FIG. 2, there is shown a drawing viewed through the cap for the sake of convenience of explanation. FIG. 3 is a cross-sectional view showing the resonator and the lead terminals to be housed in the oscillator. FIG. 4 is a P-view in FIG. 3 showing the resonator and the lead terminals FIG. 5 is a plan view showing a configuration of the lead terminal, and is a diagram showing one of the lead terminals in an enlarged manner. FIG. 6 is a P-view in FIG. 3 showing a heat generator and a resonator package. FIG. 7 is a functional block diagram of the oscillator. FIG. 8 is a diagram showing a configuration example of a temperature control circuit.

The oscillator 1 according to first embodiment is an oven-controlled crystal oscillator (OCXO) As shown in FIG. 1 and FIG. 2, the oscillator 1 is provided with a case 10 including a base 101 and a cap 102 bonded to the base 101, a base substrate 30 disposed on a lower surface 101r side of the base 101, and a regulator 40 mounted on an upper surface 30f of the base substrate 30. The case 10 has a housing space (a cavity) S1 constituted by the base 101 and the cap 102 bonded to an upper surface (a surface on the +Z-axis side) of a flange 101b which is disposed along an outer circumference of the base 101 and is recessed from an upper surface 101l of the base 101.

In the housing space S1 inside the case 10, there are housed a plurality of pin terminals 14 each penetrating the case 101 so as to be airtightly sealed by a seal member 103, a circuit board 8 as a board fixed to end parts on an opposite side of the pin terminals 14 to the base 101, and a resonator 2 supported by a plurality of lead terminals 12 connected to the circuit board 8 between the circuit board 8 and the cap 102 so as to have a gap with the circuit board 8. Further, on a base 101 side of the resonator 2 disposed in the housing space S1, there is coupled a heater 7 as a heat generator, and on the base 101 side of the circuit board 8, there is coupled an oscillation circuit element 4 including an oscillating circuit for the resonator 2. In other words, in the housing space S1, there are disposed the constituents such as the oscillation circuit element 4 coupled to the circuit board 8, the circuit board 8, the heater 7 coupled to the resonator 2, and the resonator 2 connected to the circuit board 8 with the lead terminals 12 from the base 101 side in a cross-sectional view from the Y-axis direction.

The base 101 constituting the case 10 is formed of a material such as Kovar, soft iron or iron nickel, and is provided with the flange 101b disposed in an outer circumferential part 102f. Further, the base 101 is provided with a plurality of through holes each penetrating from the upper surface 101f to the lower surface 101r, wherein the pin terminals 14 having electrical conductivity are inserted into the respective through holes. Each of the pin terminals 14 is formed of a hermetic terminal, and the gap between the through hole and the pin terminal 14 is airtightly sealed with the seal member 103 such as hermetic glass with respect to the base 101. Further, on the lower surface 101r of the base 101, it is possible to dispose standoffs 13 formed of an insulating material such as glass.

The pin terminals 14 are each an introduction terminal which is formed of a pin material such as Kovar, soft iron or iron nickel for electrically connecting the inside and the outside of the housing space S1, and has one end on the lower surface 101r side of the base 101 and the other end on the housing space S1 side, and is erected along the Z-axis direction. Further, the pin terminals 14 are constituted by two lines each arranged along the Y-axis direction. Although there are the line in which the four pin terminals 14 are arranged on the +X-axis direction side, and the line in which the five pin terminals 14 are arranged on the −X-axis direction side in the present embodiment, the number of lines and the number of the pins are arbitrary.

Further, the cap 102 constituting the case 10 is provided with the outer circumferential part 102f obtained by forming a metal thin film made of nickel silver, Kovar, soft iron, iron nickel or the like to have a recessed shape by, for example, a pressing process or a drawing process, and folding an opening part outward to have a flange shape.

Further, as described above, in the case 10, the housing space (the cavity) S1 is configured by mounting the outer circumferential part 102f of the cap 102 so as to overlap the flange 101b of the base 101, and then airtightly bonding (airtightly sealing) a part Q where the flange 101b and the outer circumferential part 102f overlap each other using, for example, a resistance welding method. It should be noted that the housing space S1 is airtightly sealed in a reduced-pressure atmosphere (also referred to as vacuum in some cases) such as pressure lower than the atmospheric pressure, or in an inert gas atmosphere with nitrogen, argon, helium or the like. As described above, since the base 101 and the cap 102 are airtightly sealed, it becomes difficult for the inside of the housing space S1 to be affected by the ambient temperature, and it is possible to improve the accuracy of the temperature control of the resonator 2 located inside the housing space S1.

The circuit board 8 as the board is provided with a lower surface 8r as a second surface which is a surface on the base 101 side, and an upper surface 8f as a first surface which is a surface on the opposite side to the lower surface 8r. The circuit board 8 can be formed of, for example, a printed circuit board (PCB). The circuit board 8 has a rectangular shape in a plan view from the Z-axis direction, and is provided with insertion holes arranged to be opposed to the erection positions of the pin terminals 14 fixed to the base 101. Further, the circuit board 8 is fixed to the pin terminals 14 in a state in which the ends on the housing space S1 side of the pin terminals 14 are inserted in the insertion holes. It should be noted that the pin terminals 14 can be fixed while being electrically connected to circuit interconnections (not shown) of the circuit board 8.

On the upper surface 8f as the first surface of the circuit board 8 and the lower surface 8r as the second surface thereof, there are disposed circuit patterns such as circuit interconnections and terminals not shown. Further, the circuit board 8 is provided with a through hole 9 as a housing section penetrating the circuit board 8 from the upper surface 8f to the lower surface 8r so as to open in the upper surface 8f. In the through hole 9 as the housing section, there is housed the heater 7 as the heat generator which is described later and is coupled to the resonator 2. Since it is possible to easily house the heater 7 in the through hole 9 as the housing section disposed in such a manner, it is possible to make a contribution to the reduction in height of the oscillator 1. It should be noted that although a part of the heater 7 is disposed the through hole 9 in the illustration in FIG. it is also possible to adopt a configuration in which the whole of the heater 7 is disposed in the through hole 9 providing, for example, the heater 7 has a thinner configuration.

To the circuit patterns (not shown) including the terminals and the interconnections disposed on the upper surface 8f of the circuit board 8, there is connected the plurality of lead terminals 12 for supporting the resonator 2 via an electrically conductive bonding material 15. The lead terminals 12 are disposed on the outer circumferential side of the resonator 2, and are connected to terminal electrodes (not shown) arranged along each of the two lines in which the pin terminals 14 are connected while providing the electrical connection. In other words, the resonator 2 is supported on the circuit board 8 by the plurality of lead terminals 12 via the electrically conductive bonding material 15. Here, the lead terminals 12 and the resonator 2 have a gap corresponding to the thickness of the electrically conductive bonding material 15 with the upper surface 8f of the circuit board 8. By providing the gap described above, it results in that the resonator 2 is supported with respect to the circuit board 8 in a so-called suspended state, and it is possible to make the distortion easy to occur in the lead terminals 12, and it is possible to more effectively perform the absorption of an impact or the like propagated from the circuit board 8 to the resonator 2. It should be noted that the configuration of the lead terminals 12 will be described in detail in a latter part.

Further, to the circuit patterns (not shown) of the lower surface 8r of the circuit board 8, there are connected electronic components such as the oscillation circuit element 4 including the oscillating circuit for the resonator 2, a temperature sensor 5, and a digital to analog (D A) conversion element 6. It should be noted that electronic components other than the above can also be connected to the circuit board 8.

As shown in FIG. 3, the resonator 2 includes a resonator package 20, and a resonator element 3 housed in the resonator package 20. The resonator package 20 has a package base 21, a lid 22 and a sealing ring 23, wherein the resonator element 3 is mounted on the package base 21, the lid 22 is bonded to the package base 21 so as to form a housing space S2 with the package base 21 for housing the resonator element 3, and the sealing ring 23 is shaped like a frame, and is located between the package base 21 and the lid 22 to bond the package base 21 and the lid 22 to each other. The package base 21 includes a base substrate 24, a first step part 26 and a second step part 25, wherein the first step part 26 opens on the lid 22 side, and the second step part 25 opens on the bottom surface side (the base substrate 24 side) of the first step part 26.

The package base 21 has a cavity-like shape having a recessed part opening in the +Z-axis direction, and has a roughly square rectangular outer shape in a plan view from the Z-axis direction. It should be noted that the outer shape of the package base 21 is not limited to the roughly square shape, but can also be another rectangular shape. In the package base 21, a direction from the bottom surface of the package base 21 toward the opening along the Z axis is set to the +Z-axis direction, and a direction from the opening of the package base 21 toward the bottom surface along the Z axis is set to the −Z-axis direction. Here, on the recessed part of the package base 21, there are exposed the first step part 26 and the second step part 25.

The resonator element 3 is fixed to internal terminals (not shown) disposed on the second step part 25 of the package base 21 via a fixation member 29 having electrical conductivity such as an electrically conductive adhesive in the outer edge part of the resonator element 3. A quartz crystal substrate 31 constituting the resonator element 3 is what is obtained by shaping an SC-cut quartz crystal substrate into a roughly circular planar shape (not shown) by mechanical processing or the like. By using the SC-cut quartz crystal substrate, it is possible to obtain the resonator element 3, which is small in frequency jump or rise in resistance due to a spurious vibration, and is also stable in temperature characteristic. It should be noted that the planar shape of the quartz crystal substrate 31 is not limited to a circular shape, but can also be a nonlinear shape such as an elliptical shape or an oval shape, or can also be a linear shape such as a triangular shape or a rectangular shape. It should be noted that by shaping the quartz crystal substrate 31 into a circular shape as in the present embodiment, symmetry of the quartz crystal substrate 31 is improved, and it is possible to effectively suppress the oscillation in sub-vibration (spurious vibration) mode.

It should be noted that in the resonator element 3, besides the SC-cut quartz crystal resonator, it is possible to use, for example, an AT-cut, BT-cut, Z-cut or LT-cut quartz crystal resonator, or a surface acoustic wave (SAW) resonator. Further, as the resonator element 3, it is also possible to use, for example, a piezoelectric resonator other than crystal resonators, or an MEMS (micro electro mechanical systems) resonator. As a substrate material of the resonator element 3, there can be used a piezoelectric single crystal such as a quartz crystal, aluminum nitride (AlN), lithium tantanate ($LiTaO_3$), lithium niobate ($LiNbO_3$), lead zirconate titanate (PZT), or a piezoelectric material such as piezoelectric ceramics including lead zirconate titanate, or a silicon semiconductor material. Further, it is also possible to use a laminated piezoelectric substrate configured by stacking a piezoelectric material such as aluminum nitride or tantalum pentoxide ($Ta_2O_5$) on a glass substrate, or a piezoelectric resonator element using piezoelectric ceramics or the like. Further, it is also possible to use a resonator element having piezoelectric element disposed on a silicon substrate. Further, as an excitation device of the resonator element 3, there can be used a device using a piezoelectric effect, or electrostatic drive using Coulomb force.

The lid 22 has a plate-like shape, and is bonded to an end surface on the +Z-axis side of the package base 21 via the sealing ring 23 so as to close the opening of the recessed part. The sealing ring 23 is disposed so as to have a frame shape, and is located between an end surface on the +Z-axis side of the package base 21 and the lid 22. The sealing ring 23 is formed of a metal material, and by the sealing ring 23 melting, the package base 21 and the lid 22 are airtightly bonded to each other. As described above, by the opening of the recessed part closed by the lid 22, the second housing space (a second cavity) S2 is formed, and it is possible to house the resonator element 3 in the second housing space S2.

The second housing space S2 of the resonator package 20 sealed airtightly is set to a reduced-pressure state (e.g. in a level no higher than about 10 Pa). Thus, it is possible to continue stable drive of the resonator element 3. As described above, by setting the second housing space S2 to the reduced-pressure state, the second housing space S2 functions as a heat-insulating layer, and the resonator element 3 becomes difficult to be affected by the external temperature variation. It should be noted that the atmosphere in the second housing space S2 is not particularly limited, but can be filled with an inert gas such as nitrogen or argon to be at the atmospheric pressure.

The constituent material of the package base 21 is not particularly limited, but a variety of types of ceramics such as aluminum oxide can be used. In this case, by calcining a stacked body of ceramic sheets (green sheets), it is possible to manufacture the package base 21. Further, the constituent material of the lid 22 is not particularly limited, but a member with a linear expansion coefficient similar to that of the constituent material of the package base 21 is preferable. For example, in the case in which the ceramics described above is used as the constituent material of the package base 21, it is preferable to use a metal material (an alloy such as Kovar) as the constituent material of the lid 22.

On a lower surface 21r of the package base 21, there is disposed, for example, a plurality of external terminals 27 provided with electrical conduction with the resonator element 3 using internal interconnections (not shown). Specifically, as shown in FIG. 4, the four external terminals 27 are arranged along the outer edge located on the +X-axis direction side, and h four external terminals 7 are arranged along the outer edge located on the −X-axis direction side which is an opposite side to the +X-axis direction side. It should be noted that the numbers of the external terminals 27 are not particularly limited, but each can also be set to an arbitrary number. The external terminals 27 can be formed by a method of screen-printing a metal interconnection material such as tungsten (W) or molybdenum (Mo) on the lower surface 21r of the package base 21 and then calcining the metal interconnection material thus printed, and then performing plating thereon with nickel (Ni), gold (Au) and so on. It should be noted that the lower surface 21r of the package base hereinafter referred to also as the lower surface 21r of the resonator in some cases.

To the external terminals 27 disposed on the lower surface 21r of the resonator 2, there are respectively fixed the lead terminals 12 so as to provide an electrical connection using, for example, an electrically conductive adhesive or soldering. The resonator 2 is supported by the circuit board 8 in a so-called suspended state via the lead terminals 12 by the lead terminals 12 being fixed to the upper surface 8f of the circuit board 8 so as to provide the electrical connection with the electrically conductive bonding material 15. Here, the electrically conductive bonding material 15 is disposed between a mounting pad 12b of the lead terminal 12 and the circuit board 8 in a cross-sectional view from a direction (the Y-axis direction) along a direction perpendicular to a plan view along a direction (the Z-axis direction) perpendicular to the upper surface 8f of the circuit board 8. Thus, it is possible for the lead terminal 12 in an area except the disposition positions of the electrically conductive bonding material 15 to have a space (a gap) with the circuit board 8, and it becomes easy to cause distortion. Therefore, it is possible to enhance an impact absorbing effect exerted by the lead terminal 12.

As shown in FIG. 4 and FIG. 5, each of the lead terminals 12 includes a connection terminal 12a disposed at a position including one end, a mounting pad 12b disposed at a position including the other end, and a support lead section 12c disposed between the connection terminal 12a and the mounting pad 12b to couple the connection terminal 12a and the mounting pad 12b to each other.

The plurality of lead terminals 12 is arranged along the Y-axis direction (a first direction) on each of the both sides in the X-axis direction (a second direction) of the resonator package 20 in a plan view along a direction (the Z-axis direction) perpendicular to the upper surface 8f of the circuit hoard 8. It should be noted that in the present embodiment, the four lead terminals 12 are disposed on each of the both sides in the X-axis direction (the second direction) of the resonator package 20.

The connection terminal 12a is a terminal to be connected to the external terminal 27 disposed on the lower surface 21r of the resonator 2, and has two slits 12e in one side of a rectangular shape. These slits 12e can each be made to function as an anchor for improving the bonding strength between the resonator 2 and the external terminal 27. It should be noted that the number of the slits 12e disposed is not limited to two, but can also be an arbitrary number.

The mounting pad 12b is a terminal to be connected to the circuit board 8, and has a hole part 12d disposed in a central part of a rectangular shape so as to penetrate a reverse surface opposed to the upper surface f as the first surface of the circuit board 8 and an obverse surface on the opposite side to the reverse surface. The hole part 12d of the present configuration has a circular shape, but the shape of the hole part 12d can also be an arbitrary shape such as an elliptical shape or a rectangular shape. Such a hole part 12d forms a loophole for a bubble included in the electrically conductive bonding material 15 when connecting the lead terminal 12 to the circuit board 8, and can reduce the variation in bonding strength caused by the lead terminal 12 being connected to the circuit board 8 in the state in which the bubble is kept confined to the electrically conductive bonding material 15. Further, due to the anchor effect that the electrically conduct re bonding material 15 infiltrates the hole part 12d, it is possible to increase the bonding strength.

The support lead section 12c is configured including two folding-back shapes including a folding-back part 12f. The folding-back part 12f as a first folding-back shape includes, in a plan view along direction (the Z-axis direction) perpendicular to the upper surface 8f of the circuit board 8, a first extending part 12c1 extending from the connection terminal 12a toward one side (in the −X-axis direction), and a second extending part 12c2 which is folded back from the first extending part 12c1 via a coupling part 12c3 including a circular arc shape, and extends in the opposite direction (the +X-axis direction. Further, as a second folding-back shape, the support lead section 12c includes a third extending part 12c4 folded back from the second extending part 12c2 via a second coupling part 12c5 including a circular arc shape and extending in the opposite direction (the −X-axis direction), and a fourth extending part 12c6 which bends from the third extending part 12c4 in the −Y-axis direction as a direction crossing the X-axis direction, and is then coupled to the mounting pad 12b.

By using such lead terminals 12, due to the folding-back part 12f which includes, for example, the first extending part 12c1 and the second extending part 12c2, and is folded back to have an accordion shape via the coupling part 12c3, the support lead section 12c becomes easy to be distorted in a horizontal direction (a direction between the X-axis direction and the Y-axis direction) along the upper surface 8f as the first surface of the circuit board 8, and it is possible to enhance a cushioning action by the lead terminal 12 in the case in which an impact is applied in the horizontal direction.

Further, as shown in FIG. 4, the plurality of lead terminals 12 is arranged so that the four lead terminals 12 are arranged along the Y-axis direction on each of the both sides in the X-axis direction (the second direction) of the resonator package 20. Then, the support lead section 12c of each of the lead terminals 12 thus arranged has a shape line-symmetrical about a first center line C1 passing through the center G of the resonator package 20 described above along the Y-axis direction (the first direction), and has a shape line-symmetrical about a second center line C2 passing through the center G of the resonator package 20 along the X-axis direction (the second direction) perpendicular to the Y-axis direction (the first direction). As described above, since the support lead section 12c has the shape line-symmetrical about the first center line C1, and has the shape line-symmetrical about the second center line C2, the holding balance of the resonator package 20 with respect to the circuit board 8 is improved, and at the same time, the cushioning effect can also be improved. it should be noted that it is also possible for the mounting pad 12b to have the shape line-symmetrical about the first center line C1 and at the same time have the shape line-symmetrical about the second center line C2 in addition to the support lead section 12c. As described above, even in the configuration in which the support lead section 12c and the mounting pad 12b each have the shape line-symmetrical about the first center line C1, and each have shape line-symmetrical about the second center line C2, the holding balance of the resonator package 20 with respect to the circuit board 8 is improved, and at the same time, the cushioning effect can also be improved. Further, in the present embodiment, the center G denotes a position overlapping, for example, the centroid of the resonator 2 in the plan view.

It should be noted that although there is described the configuration in which the four lead terminals 12 are arranged on each of the both sides in the X-axis direction (the second direction) of the resonator package 20, the number of the lead terminals 12 is not limited, but can also be an arbitrary number providing the lead terminals 12 are capable of supporting the resonator 2.

The oscillation circuit element 4 includes at least an oscillation circuit 530 (see FIG. 7) as an oscillating circuit for oscillating the resonator 2, and a temperature control circuit 560 (see FIG. 7), and is coupled to the lower surface 8r of the circuit board 8.

The heater 7 as a heat generator is an electronic component which is coupled to the lower surface 21r as a surface on the base 101 side of the resonator 2, and has a so-called "constant-temperature function" of heating the resonator element 3 of the resonator 2 to keep the temperature of the resonator 2 (the resonator element roughly constant By keeping the temperature of the resonator 2 (the resonator element 3) roughly constant, it is possible to suppress the fluctuation of the oscillation frequency due to the temperature fluctuation in the outside (usage environment), and thus, it is possible to keep the excellent frequency stability. It should be noted that in the oscillator 1 according to the present embodiment, it is preferable to control the temperature of the resonator element 3 so as to approach a peak temperature e.g., roughly 70° C. through 100° C. although different by the specification) representing zero temperature coefficient. Thus, it is possible to exert more excellent frequency stability.

Further, as shown in FIG. 6, the heater 7 according to the present embodiment is an NPN bipolar transistor, and is provided with a collector terminal 71, a base terminal 72 and an emitter terminal 73. On the lower surface 21r of the resonator package 20, there are disposed a first pad 91, a second pad 92, a third pad 93, a first interconnection 85, a second interconnection 85, a third interconnection 87 and the external terminals 27 (see FIG. 4), wherein the respective terminals of the heater 7 are connected to the first pad 91, the second pad 92 and the third pad 93, and the lead terminals (see FIG. 4) are respectively connected to the external terminals 27. Further, the collector terminal 71 is connected to the first pad 91, the base terminal 72 is connected to the second pad 92, and the emitter terminal 73 is connected to the third pad 93.

The first pad 91 is electrically connected to a first terminal 81 out of the external terminals 27 (see FIG. 4) via the first interconnection 85. Further, to the first terminal 81, there is connected the first lead terminal 122 out of the lead terminals 12 to provide an electrical connection with the circuit board 8. Further, the second pad 92 is electrically connected to a second terminal 82 out of the external terminals 27 (see FIG. 4) via the second interconnection 86. Further, to the second terminal 82, there is connected the second lead terminal 126 out of the lead terminals 12 to provide an electrical connection with the circuit board 8. Further, the third pad 93 is electrically connected to a third terminal 83 out of the external terminals 27 (see FIG. 4) via the third interconnection 87. Further, to the third terminal 83, there is connected the third lead terminal 121 out of the lead terminals 12 to provide an electrical connection with the circuit board 8. It should be noted that in FIG. 6, in order to make the areas of the first interconnection 85, the second interconnection 86 and the third interconnection 87 clear, the portions of the first interconnection 85, the second interconnection 86 and the third interconnection 87 are indicated by hatching for the sake of convenience.

Further, preferably, the wiring length D1 of the first interconnection 85 as the length along the first interconnection 85 is longer than the wiring length D2 of the second interconnection 86 as the length along the second interconnection 86, and at the same time, longer than the wiring length D3 of the third interconnection 87 as the length along the third interconnection 87. By making the wiring length D1 of the first interconnection 85 longer as described above, the wiring length (the wiring length of the first interconnection 85) from the collector terminal 71 large in heat generation amount to the circuit board 8 becomes long, and thus, it is possible to reduce an amount of heat leaked from the heater to the circuit board 8 (see FIG. 1) via the first interconnection 85 and the first lead terminal 122 to more efficiently control the temperature of the resonator 2.

The temperature sensor 5 coupled to the lower surface 8r of the circuit board 8 is disposed in the vicinity of the resonator 2 to detect the temperature (the temperature of a thermostatic oven) of the resonator 2. As the temperature sensor 5, there can be used, for example, a thermistor (e.g., an NTC (negative temperature coefficient) thermistor or a PTC (positive temperature coefficient) thermistor) or a platinum resistor.

A D/A conversion element 6 coupled to the lower surface 8r of the circuit board 8 includes a reference voltage generation circuit 570, a D/A conversion circuit 580, a digital interface circuit 590 and so on shown in FIG. 7, and processes a signal input from an external terminal 1a of the oscillator 1 to output a control signal of the frequency. It should be noted that it is also possible for the D/A conversion element 6 to have a configuration obtained by eliminating or modifying some of these constituents, or adding other constituents.

Going back to FIG. 1, it is possible for the base substrate 30 disposed on the lower surface 101r side of the base 101 to be formed of, for example, a printed circuit board (PCB). The base substrate 30 is provided with an upper surface 30f located on the base 101 side, and a lower surface 30r as a surface on the opposite side to the upper surface. The base substrate 30 is provided with bottomed holes 34 on the upper surface 30f opposed to the erection positions of the pin terminals 14 fixed to the base 101. The base substrate 30 is connected to the pin terminals 14 with bonding material 33 such as soldering with one ends of the pin terminals 14 inserted into the bottomed holes 34, Further, to the upper surface 30f of the base substrate 30, there is coupled the regulator 40. Further, on the lower surface 30r of the base substrate 30, there is disposed a plurality ref external connection terminals 32.

The regulator 40 coupled to the upper surface 30f of the base substrate 30 has a function of a voltage regulator for smoothing the DC power input, and making the DC power be a constant voltage, and then outputting the DC power to adjust the power supply voltage to be supplied to the heater 7 to a constant voltage. It should be noted that the regulator 40 is capable of always outputting a constant voltage even if the input voltage or the output current changes. By providing such a regulator 40, it is possible to reduce the fluctuation of the power supply voltage to be applied to the heater 7, and thus, it is possible to reduce the temperature variation of the heater 7 due to the fluctuation of the power supply voltage.

Then, a functional configuration of the oscillator 1 according to the first embodiment will be described with reference to the functional block diagram shown in FIG. 7. It should be noted that the description similar the configuration described above will be omitted. As shown in FIG. 7, the oscillator 1 is configured including the resonator 2, the oscillation circuit element 4 including the oscillating circuit, the temperature sensor 5, the D/A conversion element 6, the heater 7 as the heat generator which is a temperature control element, a variable capacitance element 507, a variable capacitance element 508, and so on. It should be noted that the oscillator 1 according to the present embodiment can be provided with a configuration obtained by eliminating or modifying some of the constituents shown in FIG. 7, or adding other constituents.

The D/A conversion element 6 is configured including the reference voltage generation circuit 570, the D/A conversion circuit 580 and the digital interface circuit 590. It should be noted that it is also possible for the D/A conversion element 6 to have a configuration obtained by eliminating or modifying some of these constituents, or adding other constituents.

The interface circuit 590 is electrically connected to the external terminal 1a of the oscillator 1, obtains a signal (a signal including digital data for controlling the frequency of the oscillation circuit 530) input from the external terminal 1a, then converts the signal thus obtained into N-bit data signal, and then output the data signal to the D/A conversion circuit 580.

The reference voltage generation circuit 570 generates a high-potential-side reference voltage VDH and a low-potential-side reference voltage VDL of the D/A conversion circuit 580 based on a power supply voltage VCC supplied from the outside (the outside of the oscillator 1) of the D/A conversion element 6.

The D/A conversion circuit 580 converts the digital signal input via the digital interface circuit 590 into an analog signal to generate a frequency control signal for controlling the frequency of the oscillation circuit 530. Specifically, the N-bit data signal (the digital data for controlling the frequency of the oscillation circuit 530) output by the digital interface circuit 590 is input to the D/A conversion circuit 580, and then the D/A conversion circuit 580 converts the N-bit data signal into an analog signal having a voltage between the high-potential-side reference voltage VDH and the low-potential-side reference voltage VDL, and then outputs the result. As the D/A conversion circuit 580, there can be used variety of well-known types such as a resistance voltage dividing type (also called a voltage dividing type, a resistor string type, or a voltage potentiometer type), a resistance ladder type (e.g., R-2R ladder type), a capacitance array type, and a delta sigma type.

The voltage (control voltage) VC of the analog signal output by the D/A conversion circuit 580 is applied to the variable-capacitance element 508 located outside the D/A conversion element 6, and the capacitance value of the variable-capacitance element 508 varies in accordance with the control voltage VC. The variable-capacitance element 508 can also be, for example, a varicap diode (a varactor) varied in capacitance value in accordance with the control voltage VC applied to one end.

The oscillation circuit element 4 is configured including a temperature compensation circuit 510, a temperature sensor 513, an oscillating circuit 532, temperature control circuit 560, a reference voltage generation circuit 572, a digital interface circuit 592 and a storage section 600. It should be noted that the oscillation circuit element 4 is, for example, an integrated circuit (IC). It should be noted that it is also possible for the oscillation circuit element 4 to have a configuration obtained by eliminating or modifying some of these constituents, or adding other constituents.

The temperature compensation circuit 510 is connected to the temperature sensor 513, and generates a temperature compensation voltage TC in accordance with an output signal of the temperature sensor 513, wherein the frequency-temperature characteristic of the output signal of the oscillation circuit 530 is corrected by the temperature compensation voltage TC.

The temperature sensor 513 is, for example, for outputting a voltage corresponding to the ambient temperature of the temperature sensor 513, and can be a positive type, in which the higher the temperature is, the higher the output voltage is, or can also be a negative type, in which the higher the temperature is, the lower the output voltage is.

The temperature compensation voltage TO output by the temperature compensation circuit 510 is applied to a variable-capacitance element 507 located outside the oscillation circuit element 4, and the capacitance value of the variable-capacitance element 507 varies in accordance with the temperature compensation voltage TO. The variable-capacitance element 507 can also be, for example, a varicap diode (a varactor) varied in capacitance value in accordance with the temperature compensation voltage TO applied to one end.

The oscillating circuit 532 constitutes the oscillation circuit 530 for oscillating the resonator 2 together with the variable-capacitance element 507, the variable-capacitance element 508, and other electronic components (not shown) externally attached to the terminals of the oscillation circuit element 4. Therefore, although in the present embodiment, the oscillation circuit element 4 has the oscillating circuit 532 as a part of the oscillation circuit 530, t is also possible to adopt a configuration in which the oscillation circuit element 4 has at least a part of the oscillation circuit 530, for example, a configuration in which the oscillation circuit element 4 has the whole of the oscillation circuit 530.

The oscillation circuit 530 oscillates the resonator 2 with the frequency corresponding to the capacitance value of the variable-capacitance element 507 and the capacitance value of the variable-capacitance element 508 to output an oscillation signal VO. The oscillation signal VO output by the oscillation circuit 530 is output to the outside (the outside of the oscillator 1) of the oscillation circuit element 4.

The temperature control circuit 560 is disposed near to the resonator 2, and controls the operation of the heater 7 for controlling the temperature of the resonator 2 based on the output voltage of the temperature sensor 5 for detecting the temperature of the resonator 2 (the temperature of the thermostatic oven). Specifically, the temperature control circuit 560 controls the operation of the heater 7 in accordance with the output voltage of the temperature sensor 5 so as to keep the temperature of the resonator 2 constant.

As the heater 7, it is also possible to use, for example, a heating element (e.g., a power transistor or a resistor) for generating heat by making a current flow through the heating element, or a heat absorbing element (e.g., a Peltier element).

The reference voltage generation circuit 572 generates a power supply voltage VA of the oscillation circuit 530, a reference voltage VREF1 of the temperature compensation circuit 510, a reference voltage VREF2 of the temperature control circuit 560, and so on based on the power supply voltage VCC supplied from the outside (the outside of the oscillator 1) of the oscillation circuit element 4.

The storage section 600 stores the information based on the digital signal input via the digital interface circuit 592. For example, the storage section 600 is configured including a nonvolatile memory and a register not shown, and the nonvolatile memory stores configuration information of the temperature compensation circuit 510 and so on. The nonvolatile memory can be realized by, for example, a flash memory such as an MONOS (metal-oxide-nitride-oxide-silicon) memory, or an electrically erasable programmable read-only memory (EEPROM).

Each of the pieces of the configuration information stored in the nonvolatile memory is transferred from the nonvolatile memory to the register when powering on (when the power supply voltage VCC rises from 0 V to a desired voltage) the oscillation circuit element 4, and is then held in the register. Then, the pieces of the configuration information held in the register are supplied to the temperature compensation circuit 510 and so on.

The digital interface circuit 592 is electrically connected an external terminal 1b different from the external terminal 1a of the oscillator 1, obtains a signal input from the external terminal 1b, and then performs reading from/writing to the storage section 600 (the nonvolatile memory and the register). The di interface circuit 592 can be an interface circuit compatible with I$^2$C (Inter-Integrated Circuit) bus, or can also be an interface circuit compatible with SPI (Serial Peripheral Interface) bus.

FIG. 8 is a diagram showing a configuration example of the temperature control circuit 560. In FIG. 8, an NPN bipolar transistor is used as the heater 7, and an NTC thermistor is used as the temperature sensor 5. In the temperature control circuit 560 shown in FIG. 6, when the temperature drops, the resistance value of the temperature sensor 5 (the NTC thermistor) increases, and the input potential difference of the operational amplifier increases. By contraries, when the temperature rises, the resistance value of the temperature sensor 5 decreases, and the input potential difference of the operational amplifier decreases. The output voltage of the operational amplifier is proportional to the input potential difference. In the heater 7 (the NPN bipolar transistor), when the output voltage of the operational amplifier is higher than a predetermined voltage value, the higher the voltage value is, the higher current flows to increase the amount of heat generation, and when the output voltage of the operational amplifier is lower than the predetermined voltage value, no current flows, and the amount of heat generation gradually decreases. Therefore, the operation of the heater 7 is controlled so that the resistance value of the temperature sensor 5 becomes a predetermined value, namely so as to keep the temperature at a predetermined level.

Due to the temperature control circuit 560, the internal temperature of the thermostatic oven is controlled so as to be kept at predetermined temperature (e.g., corresponding to the upward-convex peak in the cubic curve of the frequency-temperature characteristic if the resonator 2 is an SC-cut crystal resonator) based on the frequency-temperature characteristic of the output signal of the oscillation circuit 530 determined in accordance with the temperature characteristic of the resonator 2 and the oscillation circuit element 4.

Further, between the temperature control circuit 560 and the heater 7, there is disposed a regulator 40 having a function of the voltage regulator for adjusting the power supply voltage to be supplied to the heater 7 to a constant voltage. Since it is possible for the regulator 40 to always output a constant voltage even in the case in which the input voltage or the output current varies, it is possible to reduce the fluctuation of the power supply voltage to be applied to the heater 7, and thus, it is possible to reduce the temperature variation of the heater 7 due to the fluctuation of the power supply voltage.

According to the oscillator 1 related to the first embodiment having such a configuration, the heater 7 is attached to the resonator package 20 of the resonator 2 with an electrical connection, and the resonator 2 is connected to the circuit board 8 via the lead terminals 12. Therefore, since the resonator 2 is not connected to both of the obverse and reverse surfaces of the circuit board 8 unlike the related art, but is connected only to the first surface (the upper surface 8f) as one of the surfaces, it is possible to avoid a rigid connection. Further, since the lead terminals 12 supporting the resonator 2 to the circuit board 8 are each configured including the folding-back part 12f, it is possible to absorb the impact due to the cushioning action of the lead terminals 12. Due to these circumstances, it is possible to absorb and reduce the propagation of the impact from the circuit board 8 to the resonator 2 to thereby reduce the stress caused in the support section (the mount section) of the resonator element 3 which is housed in the resonator package 20 of the resonator 2 and connected via the fixation member 29, and it is possible to improve the oscillation characteristic related to the impact resistance of the oscillator 1.

Figure 10:
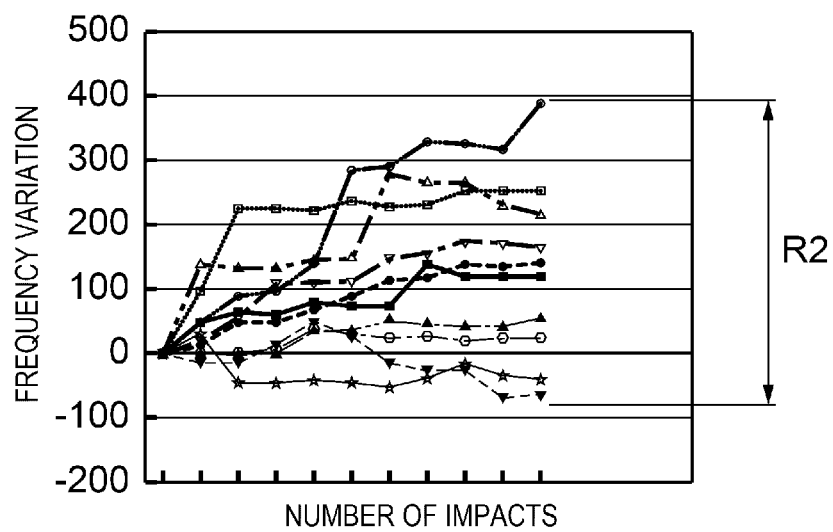
FIG. 10 is a graph showing an impact resistance characteristic of a related-art oscillator as a comparative example.
Figure 11:
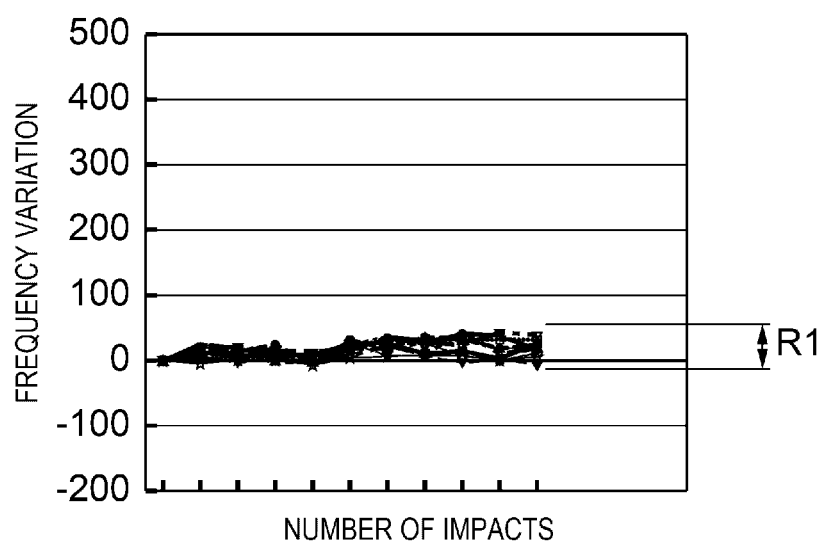
FIG. 11 is a graph showing an impact resistance characteristic of the oscillator according to the first embodiment.

Here, the confirmation result of the effect related to the impact resistance character of the oscillator 1 described above will, be described with reference to FIG. 9, FIG. 10 and FIG. 11, Here, FIG. 9 is a graph showing a simulation result of a stress variation in a support section of the resonator element when applying an impact to the oscillator. FIG. 10 is a graph showing an impact resistance characteristic (a frequency variation) of a related-art oscillator as a comparative example. FIG. 11 is a graph showing an impact resistance characteristic (a frequency variation) of the oscillator according to the first embodiment.

Figure 9:
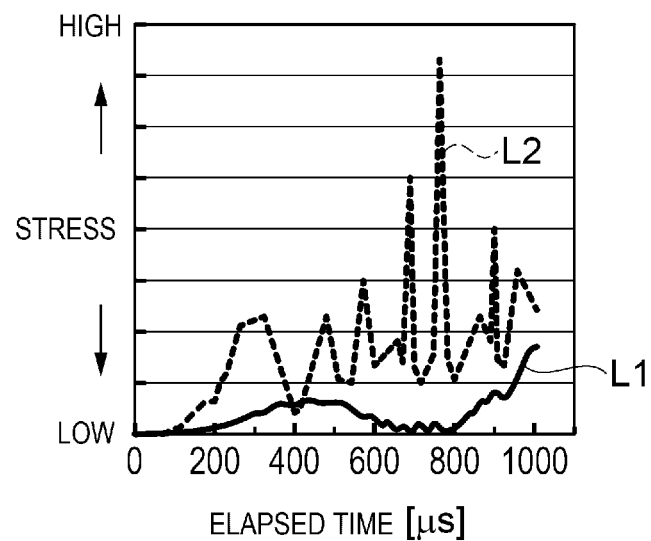
FIG. 9 is a graph showing a simulation result of a stress variation in a support section of the resonator element when applying an impact to the oscillator.

In the graph shown in FIG. 9, the horizontal axis represents the elapsed time (the impact is applied at 50 μs), the vertical axis represents the magnitude of the stress corresponding to the elapsed time, and a line segment L1 representing the state of the stress of the oscillator 1 according to the first embodiment described above and a line segment L2 representing the state of the stress of the oscillator having a related-art structure as the comparative example are plotted. As shown in the graph of FIG. 9, it is understood that the stress of the oscillator 1 according to the first embodiment represented by the line segment L1 continues in the state in which the magnitude of the stress is clearly smaller until the elapsed time of 1000 μs compared to the stress of the oscillator having the related-art structure as the comparative example represented by the line segment L2. In other words, it is understood that in the oscillator 1 according to the first embodiment, generation of the stress in the case in which the impact is applied to the oscillator 1 is reduced due to the support structure including the lead terminals 12 used in the oscillator 1.

Further, in each of the graphs shown in FIG. 10 and FIG. 11, the horizontal axis represents the accumulated number of times that an impact has been applied, and the vertical axis represents a variation of the oscillation frequency. In the graphs shown in FIG. 10 and FIG. 11, there are shown the variations of the oscillation frequency in the case in which 10 (n=10) oscillators each having the related-art structure as the comparative example and 10 oscillators 1 according to the first embodiment are respectively prepared, and then the impact is repeatedly applied.

In the result of the oscillator having the related-art structure shown in FIG. 10, the oscillation frequency significantly varies due to the application of the impact in many of the oscillators, and due to the multiple impact applications, the variation in oscillation frequency variation increases as indicated by the range R2 in the drawing.

In contrast, in the result of the oscillator 1 according to the first embodiment shown in FIG. 11, it is understood that although a Certain change occurs in the oscillation frequency due to an application of the impact, the variation of the oscillation frequency variation due to the multiple impact applications becomes as indicated by the range R1 in the drawing, which is a frequency variation equal to or lower than 1/10 compared to that in the related-art structure shown in FIG. 10. As described above, it is understood that in the oscillator 1 according to the first embodiment described above, the impact resistance property of the characteristics including the oscillation frequency, is clearly improved compared to the oscillator having the related-art structure.

Modified Example Related to Coupling of Heat Generator

Figure 12:
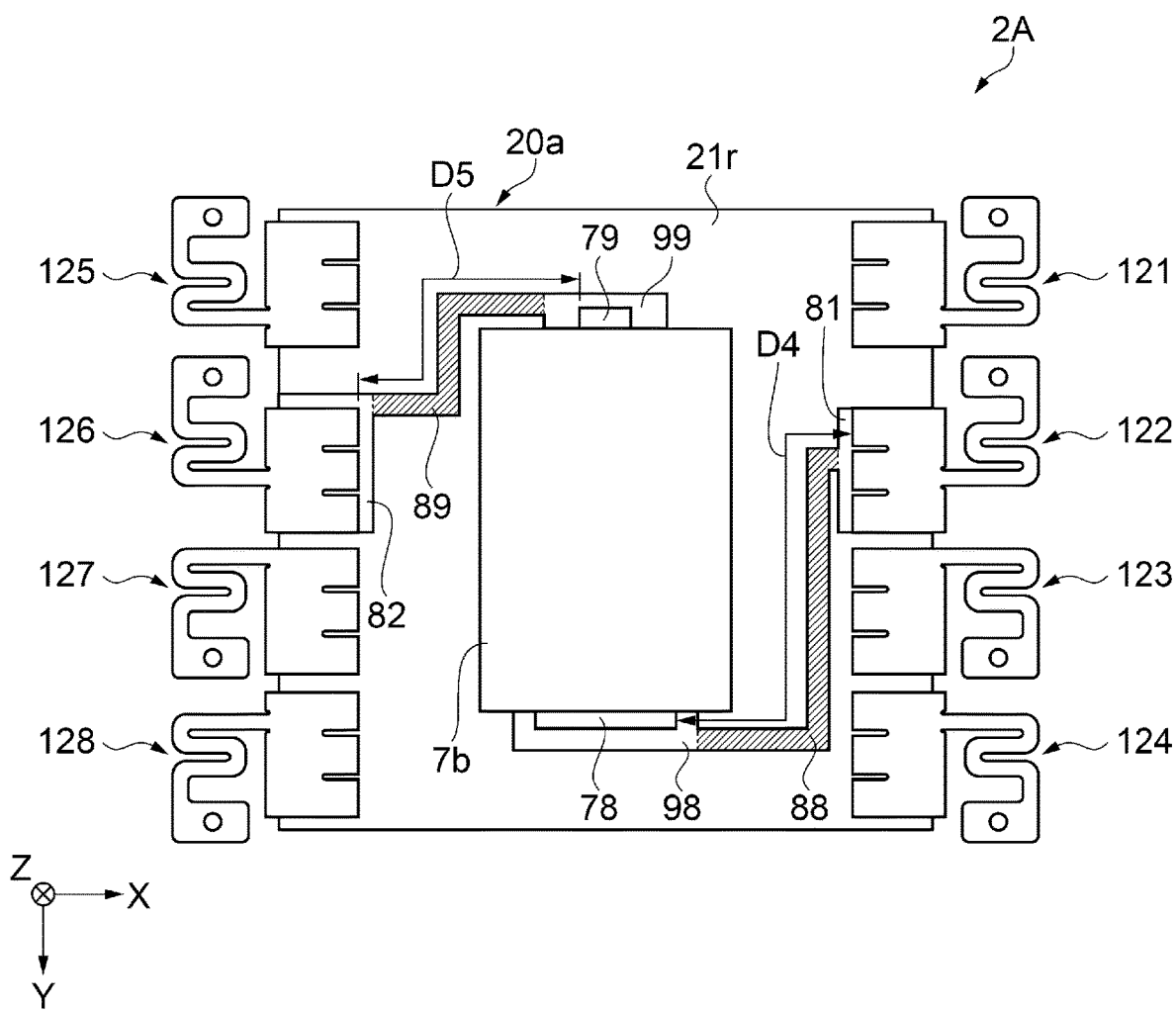
FIG. 12 is a P-view in FIG. 3 showing a modified example related to coupling of the heat generator.

The explanation is presented in the first embodiment described above illustrating the heater 7 using the NPN bipolar transistor as the heat generator, but it is also possible to use a resistor element as the heat generator instead thereof. Hereinafter, there will be described a coupling example to the resonator package 20a in the case of using a heater 7b using the resistor element as the heat generator with reference to FIG. 12. FIG. 12 is a P-view in FIG. 3 showing a modified example related to the coupling of the heat generator. It should be noted that the constituents substantially the same as those of the first embodiment described above are denoted by the same reference symbols, and the explanation thereof will be omitted.

As shown in FIG. 12, the heater 7b according to the modified example related to the coupling of the heat generator is a resistor element, and has a first heat generation terminal 78, and a second heat generation terminal 79 smaller in heat generation amount than the first heat generation terminal 78. On the lower surface 21r of the resonator package 20 of the resonator 2A, there are disposed a first pad 98, a second pad 99, a first interconnection 88, a second interconnection 89, and the external terminals 27 (see FIG. 4), wherein the first heat generation terminal 78 and the second heat generation terminal 79 of the heater 7b are connected the first pad 98 and the second pad 99, and the lead terminals 12 (see FIG. 4) are respectively connected to the external terminals 27. Further, the first heat generation terminal 78 is connected to the first pad 98, and the second heat generation pad 79 is connected to the second pad 99.

The first pad 98 is electrically connected to the first terminal 81 out of the external terminals 27 (see FIG. 4) via the first interconnection 88. Further, to the first terminal 81, there is connected the first lead terminal 122 out of the lead terminals 12 to provide the electrical connection with the circuit board 8. Further, the second pad is electrically connected to the second terminal 82 out of the external terminals 27 (see FIG. 4) via the second interconnection 89. Further, to the second terminal 82, there is connected the second lead terminal 126 out of the lead terminals 12 to provide the electrical connection with the circuit board 8. It should be noted that in FIG. 12, in order to make the areas of the first interconnection 85 and the second interconnection 86 clear, the portions of the first interconnection 88 and the second interconnection 89 are indicated by hatching for the sake of convenience.

Further, it is preferable for a distance (electrical connection length) D4 between the first heat generation terminal 78 and the first lead terminal 122 to be larger than a distance (electrical connection length) D5 between the second heat generation terminal 79 and the second lead terminal 126. Here, the distance (the electrical connection length) D4 is a length along the first interconnection 88 connecting the first pad 98 and the first terminal 81 to each other, and the distance (the electrical connect ion length) D5 is a length along the second interconnection 89 connecting the second pad 99 and the second terminal 82 to each other.

In the case in which the heater 7b is the resistance type, as shown in, for example, the drawing, it is also possible to adopt a configuration in which one terminal (the first heat generation terminal 78) is larger in width dimension than the other terminal (the second heat generation terminal 79). Thus, since the terminal area of the one terminal (the first heat generation terminal 78) becomes large, the amount of heat stored in the one terminal (the first heat generation terminal 78) becomes large. Therefore, by making the distance (the electrical connection length) D4 between the first heat generation terminal 78 and the first lead terminal 122 longer than the distance (the electrical connection length) D5 between the second heat generation terminal 79 and the second lead terminal 126 as described above, the length from the first heat generation terminal 78 larger in amount of heat generation than the second heat generation terminal 79 to the circuit board 8 via the first lead terminal 122 becomes long, and it is possible to reduce the amount of the heat leaked from the heater 7b to the circuit board 8 (see FIG. 1) via the first interconnection 88 and the first lead terminal 122, and it is possible to more efficiently control the temperature of the resonator 2A.

Modified Examples of Lead Terminals

Figure 13:
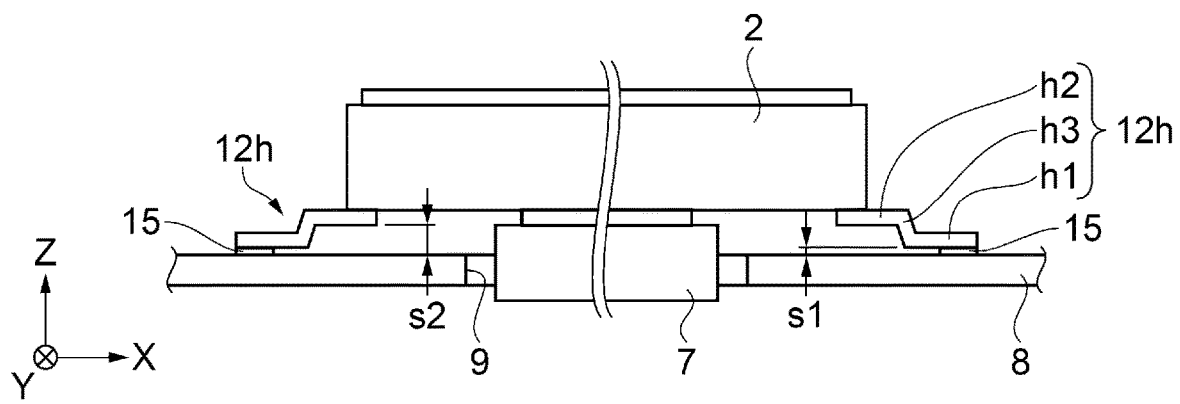
FIG. 13 is across-sectional view showing Modified Example 1 of the lead terminals.
Figure 14:
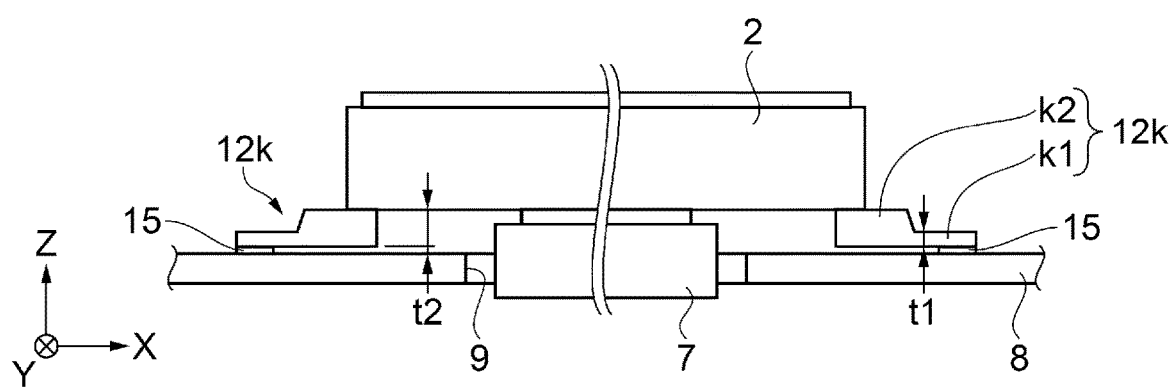
FIG. 14 is a cross-sectional view showing Modified Example 2 of the lead terminals.
Figure 15:
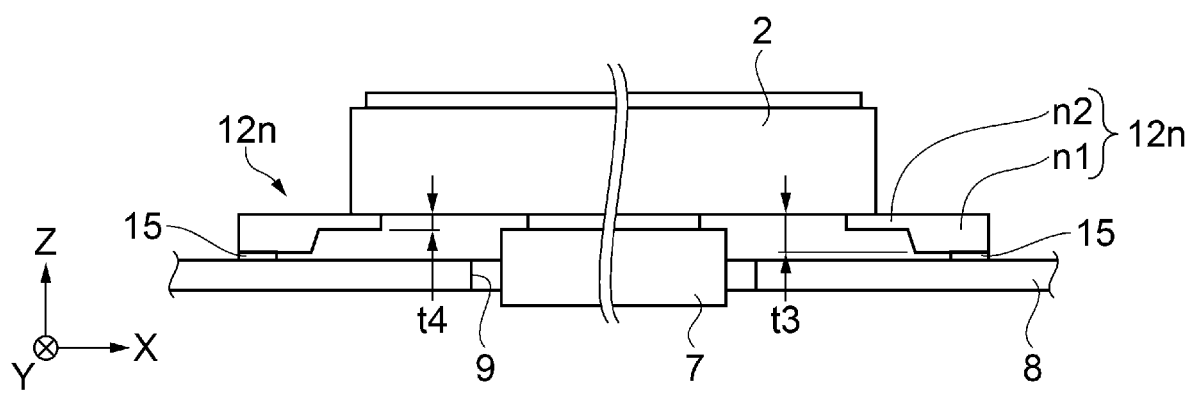
FIG. 15 is a cross-sectional view showing Modified Example 3 of the lead terminals.

Then, modified examples of the lead terminals will be described with reference to FIG. 13, FIG. 14 and FIG. 15. Here, FIG. 13 is a cross-sectional view showing Modified Example 1 of the lead terminals. FIG. 14 is a cross-sectional view showing Modified Example 2 of the lead terminals, FIG. 15 is a cross-sectional view showing Modified Example 3 of the lead terminals. It should be noted that the constituents substantially the same as those of the first embodiment described above are denoted by the same reference symbols, and the explanation thereof will be omitted.

Modified Example 1

A plurality of lead terminals 12h related to Modified Example 1 shown in FIG. 13 includes a first portion h1, a second portion 112 and a third portion h3, Wherein the first portion h1 is connected to the circuit board 8 via the electrically conductive bonding material 15, the second portion h2 is coupled to the resonator 2, and the third portion h3 connects the first portion h1 and the second portion h2 to each other in a stepped manner. In other words, the third portion h3 connects the first portion h1 and the second portion h2 to each other in a stepped manner so that the second portion h2 becomes longer in the distance from the circuit board 8 than the first portion h1. In other words, the distance s2 between the second portion h2 and the circuit board 8 is longer than the distance s1 between the first portion h1 and the circuit board 8. It should be noted that the shape of the lead terminal 12h in the plan view from the Z-axis direction is Substantially the same as that of the lead terminal 12 in the first embodiment.

According to the lead terminals 12h related to Modified Example 1, since the third portion h3 is disposed to thereby make it possible to connect the resonator 2 to the circuit board 8 with the distance from the circuit board 8 increased, it is possible to make it difficult to cause the contact between the resonator 2 and the circuit board 8 even if the lead terminals 12h are distorted, for example, in the case in which an impact is applied to the resonator 2.

Modified Example 2

A plurality of lead terminals 12k related to Modified Example 2 shown in FIG. 14 includes a first portion k1 and a second portion k2, wherein the first portion k1 is connected to the circuit board 8 via the electrically conductive bonding material 15, the second portion k2 is coupled to the resonator and the thickness t1 of the first portion k1 and the thickness t2 of the second portion k2 are different from each other. In Modified Example 2, there is adopted the configuration in which the thickness t1 of the first portion k1 is smaller than the thickness t2 of the second portion k2.

According to such lead terminals 12k each including the first portion k1 and the second portion k2, it is possible to appropriately set the balance between the support force for the resonator 2 and the distortion for cushioning in the lead terminal 12k, and at the same time, the thickness of the first portion k1 is made smaller than the thickness of the second portion k2 to thereby provide a more minute shape to the first portion k1 to be connected to the circuit board 8, and thus, it becomes possible to achieve the connection in a narrow range.

Modified Example 3

A plurality of lead terminals 12n related to Modified Example 3 shown in FIG. 15 includes a first portion n1 and a second portion n2, wherein the first portion n1 is connected to the circuit board 8 via the electrically conductive bonding material 15, the second portion n2 is coupled to the resonator 2, and the thickness t3 of the first portion n1 and the thickness t4 of the second portion n2 are different from each other. In Modified Example 3, there is adopted the configuration in which the thickness t3 of the first portion n1 is larger than the thickness t4 of the second portion n2.

According to the lead terminals 12n related to Modified Example 3, since thickness t3 of the first portion n1 is larger than the thickness t4 of the second portion n2, it is possible to connect the resonator 2 to the circuit board 8 with the distance from the circuit board 8 increased, and thus it is possible to make it difficult to cause the contact between the resonator 2 and the circuit board 8 even if the lead terminals 12n are distorted, for example, in the case in which an impact is applied to the resonator 2.

Second Embodiment

Figure 16:
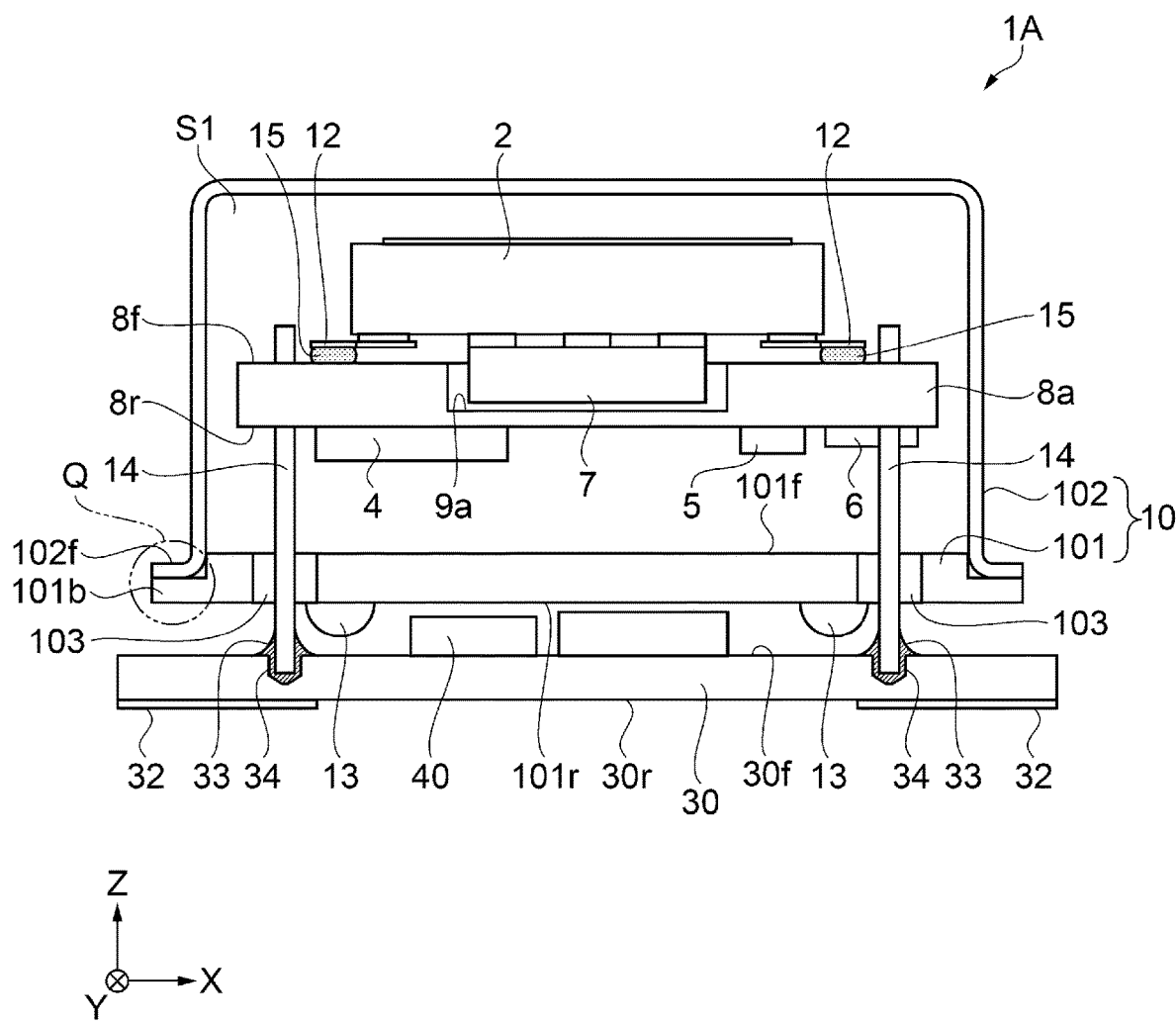
FIG. 16 is a cross-sectional view of an oscillator according to a second embodiment.

Then, an oscillator according to a second embodiment will be described in detail with reference to FIG. 16. FIG. 16 is a cross-sectional view of the oscillator according to the second embodiment. It should be noted that in the following description related to the second embodiment, the description will be presented with a focus on the configuration different from that of the first embodiment described above, and substantially the same configuration will be denoted by the same reference numerals in each of the drawings, and the description thereof will be omitted in some cases.

The oscillator 1A according to the second embodiment shown in FIG. 16 is substantially the same as the oscillator 1 according to the first embodiment described above except the point that a configuration of a circuit board 8a to which the lead terminals 12 for supporting (suspending) the resonator 2 housed in the housing space (cavity) S1 are connected is different. Hereinafter, the description will be presented with the focus on the configuration of the circuit board 8a as the different constituent.

As shown in FIG. 16, the oscillator 1A according to the present embodiment is provided with the case 10 including the base 101 and the cap 102 bonded to the base 101, the base substrate 30 disposed on the lower surface 101r side of the base 101, and the regulator 40 mounted on the upper surface 30f of the base substrate 30. The case 10 has the housing space (the cavity) S1 constituted by the base 101 and the cap 102 bonded to the upper surface (a surface on the +Z-axis side) of the flange 101b which is disposed along the outer circumference of the base 101 and is recessed from the upper surface 101f of the base 101. These constituents are substantially the same as in the first embodiment, and therefore, the description thereof will be omitted.

In the housing space 81 inside the case 10, there are housed the plurality of pin terminals 14 each penetrating the base 101 so as to be airtightly sealed by the seal member 103 as hermetic terminals, the circuit board 8a as a board fixed to the end parts on an opposite side of the pin terminals 14 to the base 101, and the resonator 2 supported by the plurality of lead terminals 12 connected to the circuit board 8a between the circuit board 8a and the cap 102 so as to have a gap with the circuit board 8a. Further, on the base 101 side of the resonator 2 disposed in the housing space S1, there is coupled the heater 7 as the heat generator, and on the base 101 side of the circuit board 8a, there is coupled the oscillation circuit element 4 including the oscillating circuit for the resonator 2. Here, as described above, the constituents other than the circuit board 8a, for example, the resonator 2, the oscillation circuit element 4 and so on, are substantially the same as in the first embodiment, and therefore, the description thereof will be omitted.

The circuit board 8a as the board is provided with the lower surface 8r as the second surface which is the surface on the base 101 side, and the upper surface 8f as the first surface which is the surface on the opposite side to the lower surface 8r. The circuit board 8a can be formed of, for example, a printed circuit board (PCB) The circuit board 8a has a rectangular shape in the plan view from the Z-axis direction, and is provided with the insertion holes arranged to be opposed to the erection positions of the pin terminals 14 fixed to the base 101. Further, the circuit board 8a is fixed to the pin terminals 14 in a state in which the ends on the housing space S1 side of the pin terminals 14 are inserted in the insertion holes. It should be noted that the pin terminals 14 can be fixed while being electrically connected to the circuit interconnections (not shown) of the circuit board 8a.

On the upper surface 8f as the first surface of the circuit board 8a and the lower surface 8r as the second surface thereof, there are disposed circuit patterns such as circuit interconnections and terminals not shown. Further, the circuit board 8a is provided with a recessed section 9a which has a bottom and is recessed from the upper surface 8f In other words, the recessed section 9a opens on the upper surface 8f of the circuit board 8a. The recessed section 9a has a function of housing the heater 7 coupled to the resonator 2. Further, in the recessed section 9a as the housing section, there is housed the heater 7 coupled to the resonator 2. Since it is possible to easily house the heater 7 in the recessed section 9a as the housing section disposed in such a manner, it is possible to make a contribution to the reduction in height of the oscillator 1.

To the circuit patterns (not shown) including the terminals and the interconnections disposed on the upper surface 8f of the circuit board 8a, there is connected the plurality of lead terminals 12 for supporting the resonator 2 via the electrically conductive bonding material 15 similarly to the first embodiment. The lead terminals 12 are disposed on the outer circumferential side of the resonator 2, and are connected to the terminal electrodes (not shown) arranged along each of the two lines in which the pin terminals 14 are connected while providing the electrical connection. The lead terminals 12 and the resonator 2 have a gap corresponding to the thickness of the electrically conductive bonding material 15 with the upper surface 8f of the circuit board 8a. By providing the gap described above, it results in that the resonator 2 is supported with respect to the circuit board 8a in a so-called suspended state, and it is possible to make the distortion easy to occur in the lead terminals 12, and it is possible to more effectively perform the absorption of an impact or the like propagated from the circuit board 8a to the resonator 2. It should be noted that the configuration of the lead terminals 12 is substantially the same as in the first embodiment, and therefore, the description thereof will be omitted.

Further, to the circuit patterns (not shown) of the lower surface 8r of the circuit board 8a, there are connected electronic components such as the oscillation circuit element 4 including the oscillating circuit for the resonator 2, the temperature sensor 5, and the digital to analog (D/A) conversion element 6. It should be noted that electronic components other than the above can also be connected to the circuit board 8a.

According to the oscillator 1A related to the second embodiment equipped with the circuit board 8a described hereinabove, it is possible to exert substantially the same advantages as those of the oscillator 1 according to the first embodiment.

Third Embodiment

Figure 17:
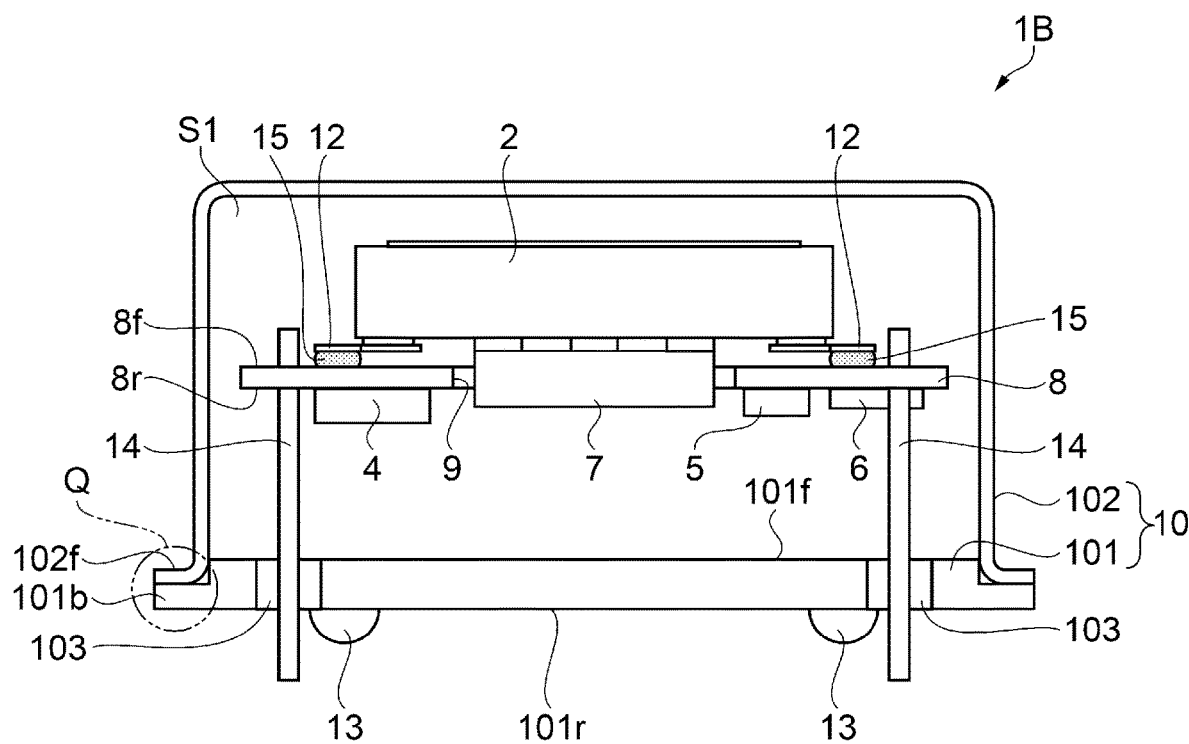
FIG. 17 is a cross-sectional view of an oscillator according to a third embodiment.

Then, an oscillator according to a third embodiment will be described in detail with reference to FIG. 17. FIG. 17 is a cross-sectional view of the oscillator according to the third embodiment. It should be noted that in the following description related to the third embodiment, the description will be presented with a focus on the configuration different from that of the first embodiment described above, and substantially the same configuration will be denoted by the same reference numerals in each of the drawings, and the description thereof will be omitted in some cases.

The oscillator 1B according to the third embodiment shown in FIG. 17 has a configuration obtained by removing the base substrate 30 disposed on the lower surface 101r side of the base 101 constituting the oscillator 1 according to the first embodiment. The other configurations, namely the configurations of the case 10 and the elements housed in the housing space S1 of the case 10, are substantially the same as in the oscillator 1 according to the first embodiment. Hereinafter, the description of the constituents substantially the same as the oscillator 1 of the first embodiment will be omitted.

As shown in FIG. 17, the oscillator 1B according to the present embodiment is provided with the case 10 including the base 101, and the cap 102 bonded to the base 101. The case 10 has the housing space (the cavity) S1 constituted by the base 101 and the cap 102 bonded to the upper surface (a surface on the +Z-axis side) of the flange 101b which is disposed along the outer circumference of the base 101 and is recessed from the upper surface 101f of the base 101.

In the housing space S1 inside the case 10, there are housed the plurality of pin terminals 14 each penetrating the base 101 so as to be airtightly sealed by the seal member 103 as the hermetic terminals, the circuit board 8 fixed to end parts on an opposite side of the pin terminals 14 to the base 101, and the resonator 2 supported by the plurality of lead terminals 12 connected to the circuit board 8 between the circuit board 8 and the cap 102 so as to have a gap with the circuit board 8. Here, the lead terminals 12 have substantially the same configuration as in the first embodiment described above, and are similarly connected to the resonator 2 and the circuit board 8. Further, on the base 101 side of the resonator 2 disposed in the housing space S1, there is coupled the ter 7 as the heat generator, and on the base 101 side of the circuit board 8, there is coupled the oscillation circuit element 4 including the oscillating circuit for the resonator 2. It should be noted that it is also possible to dispose a regulator (not shown) for regulating the power supply voltage of the heater 7 inside the housing space S1.

According to the oscillator 1B related to the third embodiment, it is possible to obtain substantially the same advantages as those of the oscillator 1 according to the first embodiment. Further, in addition, it is possible to mount the oscillator 1B on the printed circuit board of, for example, an electronic apparatus by inserting the pin terminals 14 thereto using the standoff 13 formed of an insulating material disposed on the lower surface 101r of the base 101 as a rest.

Electronic Apparatus

Figure 18:
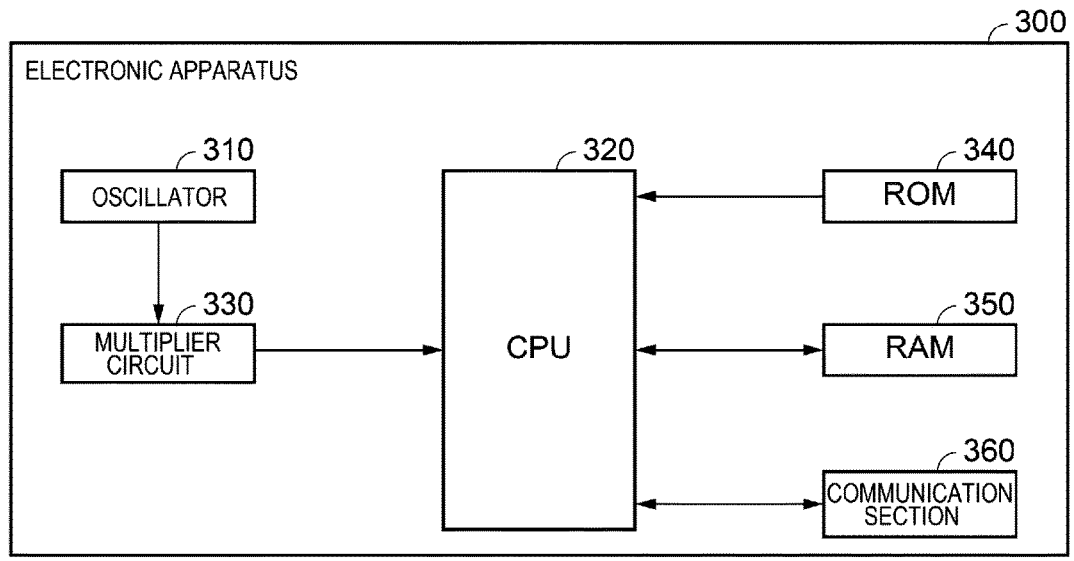
FIG. 18 is a functional block diagram showing an example of an electronic apparatus.
Figure 19:
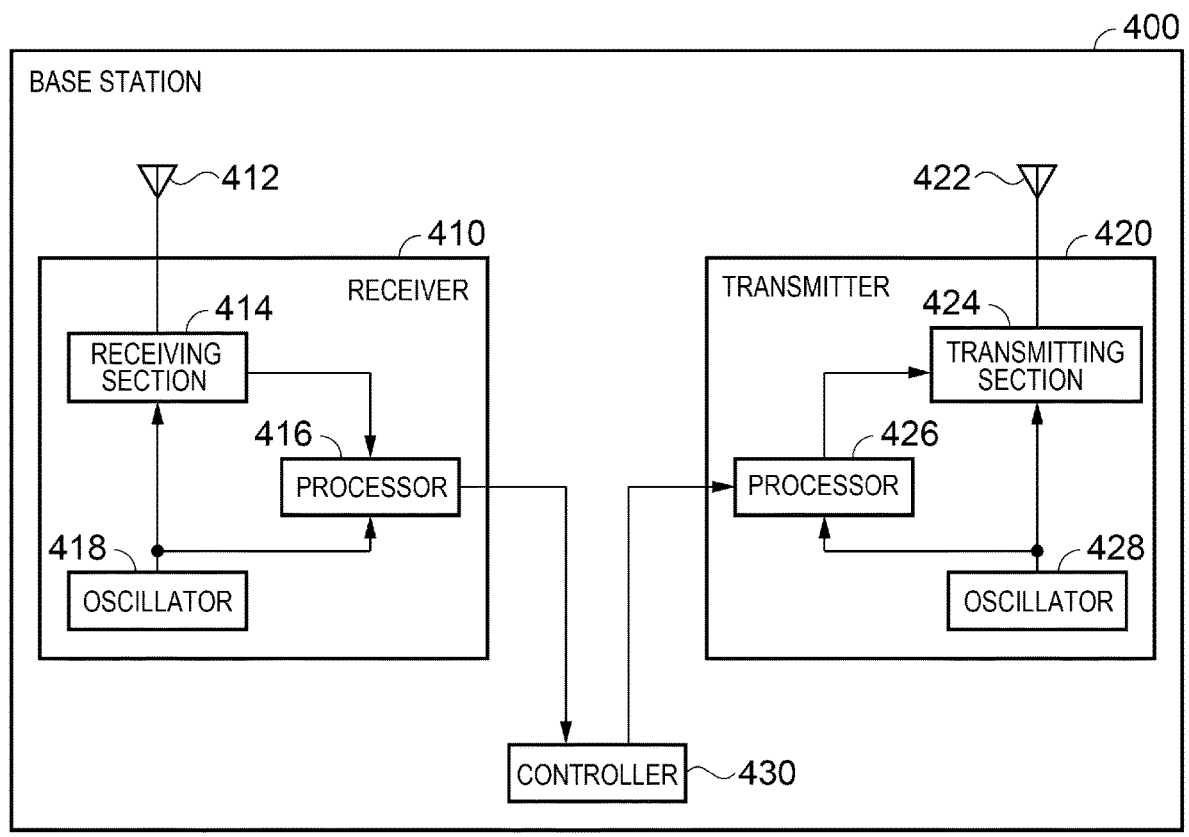
FIG. 19 is a block diagram showing an example of a schematic configuration of a base station.

Then, the electronic apparatuses to which either one of the oscillators 1, 1A and 1B according to the embodiments of the present disclosure is applied will be described in detail based on FIG. 18 and FIG. 19.

Firstly, an example of a configuration of the electronic apparatus according to the present embodiment will be described with reference to FIG. 18. FIG. 18 is a functional block diagram showing an example of the configuration of the electronic apparatus according to the present embodiment. The electronic apparatus 300 according to the present embodiment is configured including an oscillator 310, a central processing unit (CPU) 320, a multiplier circuit 330, a read only memory (ROM) 340, a random access memory (RAM) 350, and a communication section 360. It should be noted that the electronic apparatus according to the present embodiment can be provided with a configuration obtained by omitting or modifying some of the constituents (sections) shown in FIG. 18, or adding other constituents thereto.

The oscillator 310 is for outputting an oscillation signal with a desired frequency based on a signal from an oscillation source.

The multiplier circuit 330 is a circuit for multiplying the frequency of the oscillation signal output by the oscillator 310 into a desired frequency, and then outputting the result. The oscillation signal output by the multiplier circuit 330 can be used as a clock signal of the CPU 320, or can be used for the CPU 320 to generate a carrier wave for the communication.

The CPU 320 (an example of a processing circuit) performs, for example, a variety of types of arithmetic processing and control processing based on the oscillation signal output by the oscillator 310 or the oscillation signal output by the multiplier circuit 330 in accordance with the program stored in the ROM 340 and so on.

The ROM 340 stores the programs, data, and so on for the CPU 320 to perform the variety of types of arithmetic processing and control processing.

The RAM 350 is used as a working area of the CPU 320, and temporarily stores the program and data retrieved from the ROM 340, the calculation result obtained by the CPU 320 performing operations in accordance with the variety of programs, and so on.

The communication section 360 performs a variety of types of control for achieving the data communication between the CPU 320 and the external devices.

By applying any one of the oscillators 1, 1A and 1B hard to be affected by the stress such as an impact from the outside described in the above embodiments, for example, as the oscillator 310, it is possible to realize the electronic apparatus high in reliability.

As such an electronic apparatus 300, a variety of electronic apparatuses can be adopted, and there can be cited, for example, a GPS (global positioning system) module, a network apparatus, a broadcast apparatus, a communication apparatus used in an artificial satellite or a base station, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a base station apparatus for a mobile terminal, a television set, a video camera, a video cassette recorder, a car navigation system, a real-time clock device, a pager, a personal digital assistance (including one having a communication function), an electronic dictionary, an electronic calculator, an electronic game machine, a gaming controller, a ward processor, a workstation, a picture phone, a security television monitor, an electronic binoculars, a POS (point of sale) terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

Further, as an example of the electronic apparatus 300 according to the present embodiment, there can be cited a transmission device using the oscillator 310 described above as a reference signal source, and functioning as, for example, a terminal base station device for performing communication with terminals wirelessly or with wire. By applying, for example, any one of the oscillators 1, 1A and 1B according to the embodiments described above as the oscillator 310, it is also possible to realize the electronic apparatus 300 which can be used for, for example, a communication base station, which is higher in frequency accuracy than ever before, and for which high performance and high reliability are required.

Further, as another example of the electronic apparatus 300 according to the present embodiment, it is possible to adopt a communication device in which the communicator 360 receives an external clock signal, and the CPU 320 (the processor) includes a frequency controller for controlling the frequency of the oscillator 310 based on the external clock signal and one of the output signal of the oscillator 310 and the output signal (an internal clock signal) of the multiplier circuit 330. The communication device can be a communication apparatus used for, for example, a backbone network apparatus such as Stratum-3, or a femtocell.

Base Station

Here, an example of a configuration of a base station according to the present embodiment will be described with reference to FIG. 19. FIG. 19 is a block diagram showing an example of a schematic configuration of the base station according to the embodiment. The base station 400 according to the present embodiment 1 s configured including a receiver 410, a transmitter 420, and a controller 430. It should be noted that the electronic apparatus according to the present embodiment can be provided with a configuration obtained by omitting or modifying some of the constituents (sections) shown in FIG. 19, or adding other constituents thereto.

The receiver 410 is configured including a receiving antenna 412, a receiving section 414, a processor 416, and an oscillator 418.

The oscillator 418 is for outputting an oscillation signal with a desired frequency based on a signal from an oscillation source.

The receiving antenna 412 receives a radio wave with a variety of types of information superimposed from a mobile station (not shown) such as a mobile phone or a GPS satellite.

The receiving section 414 demodulates the signal received by the receiving antenna 412 into a signal a desired intermediate frequency (IF) band using the oscillation signal output by the oscillator 418.

The processor 416 example of a processing circuit) converts the signal in the intermediate frequency band demodulated by the receiving section 414 into a baseband signal using the oscillation signal output by the oscillator 418, and then detects the information included in the baseband signal.

The controller 430 receives the information detected by the receiver 410 (the processor 416) to perform a variety of processes corresponding to the information. Then, the controller 430 generates information to be transmitted to the mobile station, and then transmits the information to the transmitter 420 (a processor 426).

The transmitter 420 is configured including a transmitting antenna 422, a transmitting section 424, the processor 426, and an oscillator 428.

The oscillator 428 is for outputting an oscillation signal with a desired frequency based on a signal from an oscillation source.

The processor 426 (an example of a processing circuit) generates a baseband signal using the information received from the controller 430, and then converts the baseband signal into a signal the intermediate frequency band using the oscillation signal output by the oscillator 428.

The transmitter 424 modulates the signal in the intermediate frequency band from the processor 426 and then superimposes the result on the carrier wave using the oscillation signal output by the oscillator 428.

The transmitting antenna 422 transmits the carrier wave from the transmitting section 424 to the mobile station such as a mobile phone or a GPS satellite as a radio wave.

By applying any one of the oscillators 1, 1A and 1B hard to be affected by the stress such as an impact from the outside described in the above embodiments, for example, as the oscillator 418 provided to the receiver 410 or the oscillator 428 provided to the transmitter 420, it is possible to realize the base station excellent in communication performance and high in reliability.

Vehicle

Then, a vehicle according to the present disclosure will be described with reference to the drawing. The vehicle according to the present disclosure includes any one of the oscillator 1, 1A and 1B described above. Hereinafter, the description will be presented illustrating a car as an example of the vehicle using the oscillator 1 according to the present disclosure.

Figure 20:
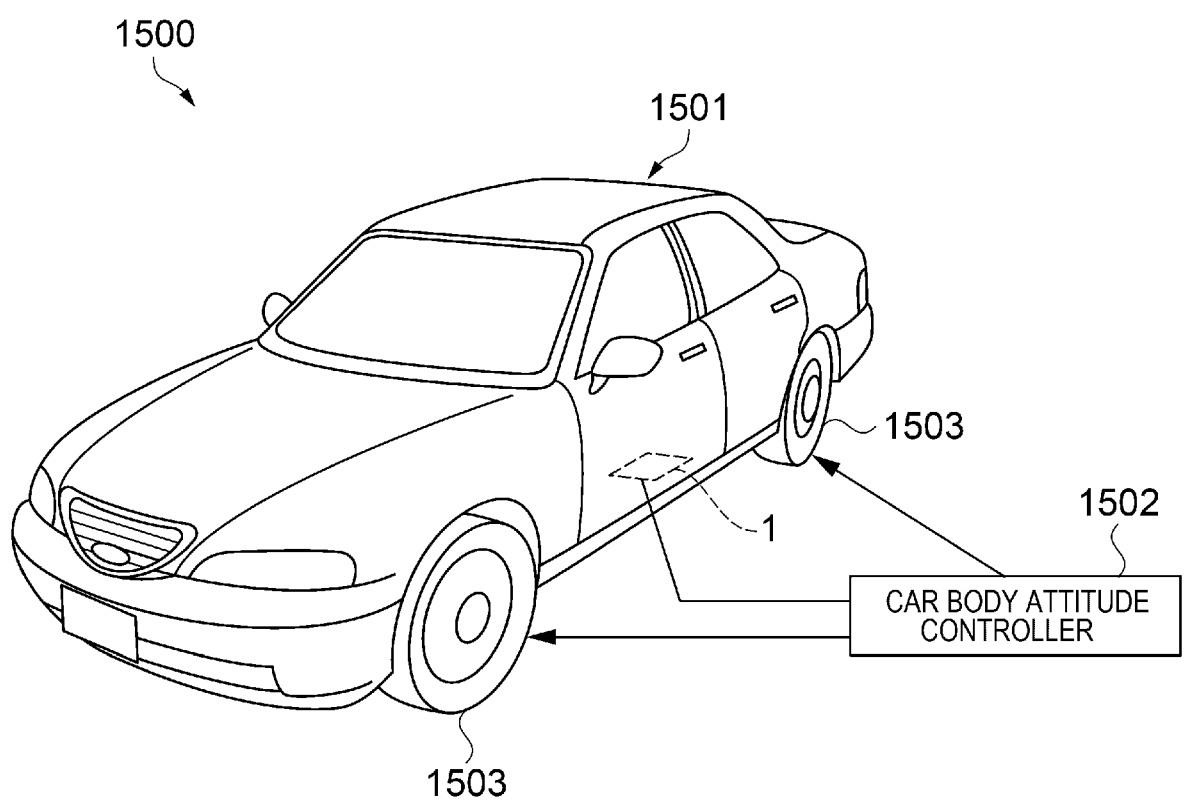
FIG. 20 is a perspective view showing a configuration of a car as an example of a vehicle.

Firstly, the car is shown as an example of the vehicle according to the present disclosure, and is then described with reference to FIG. 20. FIG. 20 is a perspective view schematically showing the car illustrated as an example of the vehicle.

The car 1500 incorporates the oscillator 1. Specifically, as shown in FIG. 20, the car 1500 is provided with a car body attitude controller 1502 including a processing circuit for performing signal processing based on an output signal of the oscillator 1. The car body attitude controller 1502 is capable of determining the attitude of a car body 1501 based on the signal to control the stiffness of the suspension, and control the brake of each of the wheels 1503 in accordance with the determination result.

Since the car 1500 uses the oscillator 1 which is improved in the impact resistance, and the thermostatic state of which is maintained, even in the case in which the car 1500 is used under a severe condition in the usage temperature environment, it is possible for the car 1500 to have a high reliability.

It should be noted that the oscillator 1 can widely be applied to an electronic control unit (ECU) such as a keyless entry system, an immobilizer, a car navigation system, a car air-conditioner, an anti-lock braking system (ABS), an airbag system, a tire pressure monitoring system (TPMS), an engine control system (an engine system), a controller of an inertial navigation for an automated cruise, or a battery monitor for a hybrid car or an electric car, besides the vehicle posture control system.

Further, besides the illustrations described above, the oscillator 1 to be applied to the vehicle can be used in, for example, movement and attitude control of a two-legged robot, an electric train and so on, remote control of a radio control airplane, a radio control helicopter, a drone and so on, movement and attitude control of an autonomous flight vehicle, movement and attitude control of an agricultural machine (a farm machine), a construction machine and so on, and control of a rocket, an artificial satellite, a ship and a boat, an automated guided vehicle (AGV) and so on. As described above, when realizing the movement (position) and attitude control of a variety of vehicles, the oscillator 1 and the respective processing circuits (not shown) for performing the signal processing based on the output signal of the oscillator 1 are incorporated.

Since such vehicles are equipped with the oscillator which is improved in the impact resistance, and the thermostatic state of which is maintained, and the respective processing circuits for performing the signal processing based on the output signal of the oscillator 1, even in the case in which the vehicle is used under a severe condition in the usage temperature environment, it is possible for the vehicle to have an excellent reliability.

The embodiments described above are illustrative only, and are not limitations. For example, it is also possible to arbitrarily combine any of the embodiments, the application examples and the modified examples with each other.

The present disclosure includes configurations (e.g., configurations having the same function, the same way, and the same result, or configurations having the same object and the same advantages) substantially the same as the configurations described as the embodiments. Further, the present disclosure includes configurations obtained by replacing a non-essential part of the configurations described as the embodiments. Further, the present disclosure includes configurations exerting the same functional effects and configurations capable of achieving the same object as the configuration described as the embodiments. Further, the present disclosure includes configurations obtained by adding known technologies to the configurations described as the embodiments.

Hereinafter, the contents derived from the embodiments described above will be described as the aspects.

Aspect 1

An oscillator according to the present aspect is characterized by including a board having a first surface, and provided with a housing section opening on the first surface, a resonator including a resonator element and a resonator package configured to house the resonator element, a heat generator attached to the resonator, electrically connected to the resonator package, and disposed inside the housing section, and a plurality of lead terminals connected to the board, and configured to support the resonator.

According to this aspect, the heat generator is attached to the resonator package of the resonator so as to electrically be connected to the resonator package, and the resonator is connected to the board via the lead terminals. Therefore, since the resonator is not coupled to both of the obverse and reverse surfaces of the board unlike the related-art configuration, but coupled to one surface, namely the first surface, it is possible to avoid rigid coupling, and at the same time absorb an impact by the lead terminals intervening therebetween, and therefore, it is possible to absorb the propagation of the impact from the board to the resonator. Thus, it is possible to reduce the stress caused in the support section (the mount section) of the resonator element to thereby improve the oscillation characteristic related to the impact resistance of the oscillator.

Aspect 2

In the oscillator according to the aspect described above, the housing section may be a through hole penetrating the board, or a recessed section having a bottom.

According to this aspect, since it is possible to easily house the heat generator inside the through hole or the recessed section having a bottom, it is possible to make a contribution to the reduction in height of the oscillator.

Aspect 3

In the oscillator according to the aspect described above, each of the lead terminals may include a mounting pad to be connected to the board, a connection terminal configured to be connected to the resonator package, and a support lead section configured to connect the mounting pad and the connection terminal to each other, the support lead section may include a folding-back part, and the folding-back part may include a first extending part extending in one direction from the connection terminal in a plan view along a direction perpendicular to the first surface, and a second extending part folded back from the first extending part via a coupling part and extending.

According to the present aspect, due to the folding-back part including the first extending part and the second extending part provided to the lead terminal, the support lead section becomes easy to be distorted in a planar direction along the first surface, and it is possible to enhance the cushioning action by the lead terminal in trio case in which an impact is applied in the planar direction.

Aspect 4

In the oscillator according to the aspect described above, the mounting pad may be provided with a hole part penetrating a reverse surface opposed to the first surface and an obverse surface on an opposite side to the reverse surface.

According to the present aspect, the hole part provided to the mounting pad forms a loophole for a bubble included in a bonding material when connecting the lead terminal to the board, and can reduce the variation in bonding strength caused by the lead terminal being connected to the board in the state in which the bubble is kept confined. Further, due to the anchor effect that the bonding material infiltrates the hole part, it is possible to increase the bonding strength.

Aspect 5

In the oscillator according to the aspect described above, a plurality of the lead terminals may be arranged along a first direction on each of both sides of the resonator package in the plan view along a direction perpendicular to the first surface, and the support lead section may have a shape line-symmetrical about a first center line passing through a center of the resonator package along the first direction, and may have a shape line-symmetrical about a second center line passing through a center of the resonator package along a second direction perpendicular to the first direction.

According to the present aspect, since the lead terminal is disposed line-symmetrical about the second center line, and the support lead section has the shape line-symmetrical about the first center line, the holding balance of the resonator package with respect to the board is improved, and it is possible to improve the cushioning effect.

Aspect 6

In the oscillator according to the aspect described above, the plurality of lead terminals may electrically be connected to the board via an electrically conductive bonding material, and the electrically conductive bonding material may be disposed between the lead terminal and the board in a cross-sectional view along a direction perpendicular to a direction perpendicular to the first surface.

According to the present aspect, each of the lead terminals is electrically connected to the board via the electrically conductive bonding material disposed between the lead terminal and the board in the cross-sectional view along the direction perpendicular to the direction perpendicular to terminal in an area except the disposition positions of the electrically conductive bonding material to have a space (a gap) with the board, and it becomes easy to cause distortion. Therefore, it is possible to enhance an impact absorbing effect exerted by the lead terminal.

Aspect 7

In the oscillator according to the aspect described above, the plurality of lead terminals may include a first part connected to the board, and a second part coupled to the resonator, and a thickness of the first part and a thickness of the second part may be different from each other.

According to the present aspect, by making the thickness of the first part and the thickness of the second part different from each other, it is possible to appropriately set the balance between the support force for the resonator and the distortion for cushioning in the lead terminal.

Aspect 8

In the oscillator according to the aspect described above, the thickness of the first part may be smaller than the thickness of the second part.

According to the present aspect, since it is possible to appropriately set the balance between the support force for the resonator and the distortion for cushioning in the lead terminal, and the thickness of the first part is smaller than the thickness of the second part, it is possible to provide the lead terminal in the first part to be connected to the board with a more minute shape, and it becomes possible to achieve a connection in an narrow range.

Aspect 9

In the oscillator according to the aspect described above, the plurality of lead terminals may include a first part connected to the board, a second part coupled to the resonator, and a third part configured to connect the first part and the second part to each other in a stepped manner, and the second part may be longer in distance from the board than the first part.

According to the present aspect, since it is possible to couple the resonator to the board with the distance from the board increased, it is possible to make the resonator and the board difficult to have contact with each other even if the lead terminals are distorted in the case in which an impact is applied, and so on.

Aspect 10

In the oscillator according to the aspect described above, the plurality of lead terminals may include a first lead terminal, a second lead terminal and a third lead terminal, the heat generator may be an NPN bipolar transistor, the resonator may include a first pad connected to a collector terminal of the heat generator, a second pad connected to a base terminal of the heat generator, a third pad connected to an emitter terminal of the heat generator, a first terminal connected to the first lead terminal, a second terminal connected to the second lead terminal, a third terminal connected to the third lead terminal, a first interconnection configured to electrically connect the first pad and the first terminal to each other, a second interconnection configured to electrically connect the second pad and the second terminal to each other, and a third interconnection configured to electrically connect the third pad and the third terminal to each other, and a wiring length of the first interconnection may be longer than a wiring length of the second interconnection, and longer than a wiring length of the third interconnection.

According to the present aspect, by making the wiring length (the wiring length of the first interconnection) from the collector terminal large in heat generation amount to the board longer, it is possible to reduce the heat amount leaked from the heat generator to the board via the first lead terminal to thereby efficiently control the temperature of the resonator.

Aspect 11

In the oscillator according to the aspect described above, the plurality of lead terminals may include a first lead terminal and a second lead terminal, the heat generator may include a first heat generation terminal and a second heat generation terminal lower in heat generation amount than the first heat generation terminal, the first heat generation terminal may electrically be connected to the first lead terminal, the second heat generation terminal may electrically be connected to the second lead terminal, and a distance between the first heat generation terminal and the first lead terminal may be longer than a distance between the second heat generation terminal and the second lead terminal.

According to the present aspect, since the distance (electrical connection length) between the first heat generation terminal larger in heat generation amount than the second heat generation terminal and the first lead terminal is longer than the distance (electrical connection length) between the second heat generation terminal and the second lead terminal, it is possible to reduce the heat amount leaked from the heat generator to the board via the first lead terminal to thereby efficiently control the temperature of the resonator.

Aspect 12

An electronic apparatus according to the present aspect is characterized in including the oscillator according to any one of Aspect 1 through Aspect 11 described above, and a processing circuit configured to perform signal processing based on an output signal of the oscillator.

According to the present aspect, it is possible to obtain the electronic apparatus capable of receiving the full benefit of the advantages of the oscillator described above, and improved in impact resistance.

Aspect 13

A vehicle according to the present aspect is characterized in including the oscillator according to any one of Aspect 1 through Aspect 11 described above, and a processing circuit configured to perform signal processing based on an output signal of the oscillator.

According to the present aspect, it is possible to obtain the vehicle capable of receiving the full benefit of the advantages of the oscillator described above, and improved in impact resistance.

What is claimed is:

1. An oscillator comprising:
a board having a first surface, and provided with a housing section opening on the first surface;
a resonator including a resonator element and a resonator package housing the resonator element;
a heat generator attached to the resonator, electrically connected to the resonator package, and disposed inside the housing section; and
a plurality of lead terminals connected to the board, and configured to support the resonator; wherein:
each of the plurality of lead terminals includes
a mounting pad connected to the board,
a connection terminal connected to the resonator package, and
a support lead section connecting the mounting pad and the connection terminal to each other;
the plurality of the lead terminals is arranged along a first direction at each of both sides of the resonator package in a plan view along a direction parallel to the first surface; and
the support lead section has a shape line-symmetrical about a first center line passing through a center of the resonator package along the first direction, and has a shape line-symmetrical about a second center line passing through a center of the resonator package along a second direction perpendicular to the first direction.

2. The oscillator according to claim 1, wherein
the housing section is one of a through hole penetrating the board and a recessed section having a bottom.

3. The oscillator according to claim 1, wherein
the support lead section includes a folding-back part, and the folding-back part includes
a first extending part extending in one direction from the connection terminal in the plan view along a direction parallel to the first surface, and
a second extending part folded back from the first extending part via a coupling part.

4. The oscillator according to claim 3, wherein
the mounting pad is provided with a hole part penetrating a reverse surface facing to the first surface and an obverse surface at an opposite side to the reverse surface.

5. The oscillator according to claim 1, wherein
the plurality of lead terminals is electrically connected to the board via an electrically conductive bonding material, and
the electrically conductive bonding material is disposed between the lead terminal and the board in a cross-sectional view along a direction perpendicular to the direction parallel to the first surface.

6. The oscillator according to claim 1, wherein
the plurality of lead terminals includes a first lead terminal, a second lead terminal and a third lead terminal,
the heat generator is an NPN bipolar transistor,
the resonator includes
a first pad connected to a collector terminal of the heat generator,
a second pad connected to a base terminal of the heat generator,
a third pad connected to an emitter terminal of the heat generator,
a first terminal connected to the first lead terminal,
a second terminal connected to the second lead terminal,
a third terminal connected to the third lead terminal,
a first interconnection configured to electrically connect the first pad and the first terminal to each other,
a second interconnection configured to electrically connect the second pad and the second terminal to each other, and
a third interconnection configured to electrically connect the third pad and the third terminal to each other, and
a wiring length of the first interconnection is longer than a wiring length of the second interconnection, and longer than a wiring length of the third interconnection.

7. The oscillator according to claim 1, wherein
the plurality of lead terminals includes a first lead terminal and a second lead terminal,
the heat generator includes a first heat generation terminal and a second heat generation terminal lower in heat generation amount than the first heat generation terminal,
the first heat generation terminal is electrically connected to the first lead terminal,
the second heat generation terminal is electrically connected to the second lead terminal, and
a distance between the first heat generation terminal and the first lead terminal is longer than a distance between the second heat generation terminal and the second lead terminal.

8. An electronic apparatus comprising:
the oscillator according to claim 1; and
a processing circuit configured to perform signal processing based on an output signal of the oscillator.

9. A vehicle comprising:
the oscillator according to claim 1; and
a processing circuit configured to perform signal processing based on an output signal of the oscillator.

10. An oscillator comprising:
a board having a first surface, and provided with a housing section opening on the first surface;
a resonator including a resonator element and a resonator package housing the resonator element;
a heat generator attached to the resonator, electrically connected to the resonator package, and disposed inside the housing section; and
a plurality of lead terminals connected to the board, and configured to support the resonator; wherein:
the plurality of lead terminals includes a first part connected to the board, and a second part coupled to the resonator; and
a thickness of the first part and a thickness of the second part are different from each other.

11. The oscillator according to claim 10, wherein
the thickness of the first part is smaller than the thickness of the second part.

12. An oscillator comprising:
a board having a first surface, and provided with a housing section opening on the first surface;
a resonator including a resonator element and a resonator package housing the resonator element;

a heat generator attached to the resonator, electrically connected to the resonator package, and disposed inside the housing section; and a plurality of lead terminals connected to the board, and configured to support the resonator; wherein:

the each of the plurality of lead terminals includes a first part connected to the board, a second part coupled to the resonator, and a third part configured to connect the first part and the second part to each other in a stepped manner, and the second part is longer in distance from the board than the first part.

* * * * *